(12) United States Patent
Yamashita et al.

(10) Patent No.: US 11,988,688 B2
(45) Date of Patent: May 21, 2024

(54) VOLTAGE DIVIDING DEVICE

(71) Applicant: Mitsubishi Electric Corporation, Tokyo (JP)

(72) Inventors: Yuya Yamashita, Tokyo (JP); Fumihito Izawa, Tokyo (JP); Seiiyu Ishimoto, Hyogo (JP); Masato Achihara, Hyogo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 257 days.

(21) Appl. No.: 17/595,262

(22) PCT Filed: May 22, 2020

(86) PCT No.: PCT/JP2020/020386
§ 371 (c)(1),
(2) Date: Nov. 12, 2021

(87) PCT Pub. No.: WO2020/241517
PCT Pub. Date: Dec. 3, 2020

(65) Prior Publication Data
US 2022/0308091 A1    Sep. 29, 2022

(30) Foreign Application Priority Data

May 29, 2019  (JP) .................. 2019-100487

(51) Int. Cl.
*G01R 15/06* (2006.01)
*G01R 19/00* (2006.01)
*G01R 27/14* (2006.01)

(52) U.S. Cl.
CPC ......... *G01R 15/06* (2013.01); *G01R 19/0084* (2013.01); *G01R 27/14* (2013.01)

(58) Field of Classification Search
CPC ...... G01R 15/06; G01R 19/008; G01R 27/14; G01R 27/02
(Continued)

(56) References Cited

U.S. PATENT DOCUMENTS 2,962,685 A * 11/1960 Langford ............ H01C 1/16
338/260
3,668,600 A *  6/1972 Schuberth .......... H01C 10/46
338/308
(Continued)

FOREIGN PATENT DOCUMENTS

JP    S63215970 A     9/1988
JP    2016195506 A   11/2016
(Continued)

OTHER PUBLICATIONS

Xie, Shijun, et al. "Development of the 10 kV Wideband Combined Resistance-capacitance Voltage Divider Unit." 2020 IEEE International Conference on High Voltage Engineering and Application (ICHVE). IEEE, 2020. (Year: 2020).*
(Continued)

*Primary Examiner* — Christopher P McAndrew
(74) *Attorney, Agent, or Firm* — BUCHANAN INGERSOLL & ROONEY PC

(57) ABSTRACT

A voltage dividing device includes: a plurality of resistive voltage dividing boards each being a plate-like board having a front face, the board having a plurality of conductor patterns arranged on the front face, the conductor patterns being connected in series with one another through capacitors and resistors connected in parallel on the front face of the board. The resistive voltage dividing boards are connected in series with one another through connecting members, and adjacent ones of the resistive voltage dividing boards are arranged so that a rear face of one of the adjacent resistive voltage dividing boards and a front face of the other
(Continued)

resistive voltage dividing board face each other and that the conductor patterns arranged on the front face of the one resistive voltage dividing board are disposed oppositely from the conductor patterns arranged on the front face of the other resistive voltage dividing board.

20 Claims, 14 Drawing Sheets

(58) Field of Classification Search
USPC .................................................. 324/126
See application file for complete search history.

(56) References Cited

U.S. PATENT DOCUMENTS

| | | | | | |
|---|---|---|---|---|---|
| 4,034,283 | A | * | 7/1977 | Pellegrino | H05G 1/265 323/370 |
| 4,475,099 | A | * | 10/1984 | Praria | H01C 17/24 338/195 |
| 4,531,111 | A | * | 7/1985 | Schmidt | H01C 17/24 323/298 |
| 5,929,746 | A | * | 7/1999 | Edwards, Jr. | H01C 1/14 338/288 |
| 7,537,963 | B2 | * | 5/2009 | Bernitz | H01G 4/224 438/107 |
| 8,963,533 | B2 | * | 2/2015 | Garabieta Artiagoitia | H01C 1/16 323/369 |
| 9,583,242 | B2 | * | 2/2017 | Hozoi | H03L 7/087 |
| 9,906,002 | B2 | * | 2/2018 | Juge | H01G 4/02 |
| 2016/0238648 | A1 | | 8/2016 | Stechemesser | |

FOREIGN PATENT DOCUMENTS

| | | |
|---|---|---|
| JP | 2017058329 A | 3/2017 |
| WO | 2018194153 A1 | 10/2018 |

OTHER PUBLICATIONS

Kyriazis, G. A., et al. "Precise resistive voltage divider for harmonic measurements." 2012 Conference on Precision electromagnetic Measurements. IEEE, 2012. (Year: 2012).*

Pogliano, Umberto, et al. "Characterization of resistive dividers for a wideband power analyzer." 29th Conference on Precision Electromagnetic Measurements (CPEM 2014). IEEE, 2014. (Year: 2014).*

Jaakola, Tuomo, et al. "Low cost printed flexible multilayer substrates." 2008 10th Electronics Packaging Technology Conference. IEEE, 2008. (Year: 2008).*

Modarres, Mohammad, et al. "Design and implementation of a resistive MV voltage divider." International Review of Electrical Engineering 12.1 (2017): 26. (Year: 2017).*

International Search Report (PCT/ISA/210) with English translation and Written Opinion (PCT/ISA/237) dated Aug. 25, 2020, by the Japan Patent Office as the International Searching Authority for International Application No. PCT/JP2020/020386.

* cited by examiner

VOLTAGE DIVIDING DEVICE

FIELD

The present invention relates to a voltage dividing device used for detecting high voltage.

BACKGROUND

A voltage dividing device is used for detecting a voltage value of voltage output from a high-voltage source, or a source of generation of a high voltage. The voltage dividing device is a device that divides voltage output from the high-voltage source, and the voltages obtained by the division by the voltage dividing device is used for detection of a voltage value.

The voltage dividing device include a resistive voltage dividing board that uses resistors to divide voltage output from a high-voltage source. A plurality of resistors and a plurality of capacitors are arranged on the resistive voltage dividing board. A voltage detecting device described in Patent Literature 1 includes a first resistor at a position of a first side of a triangle, a second resistor at a position of a second side of the triangle, and a capacitor at a position of a third side of the triangle. This arrangement makes a resistive voltage dividing board smaller in size.

CITATION LIST

Patent Literature

Patent Literature 1: Japanese Patent Application Laid-open No. S63-215970

SUMMARY

Technical Problem

The technology of Patent Literature 1, which downsizes the resistive voltage dividing board, does not allows for downsizing resistive voltage dividing boards arranged to divide a high voltage. In the case where a plurality of resistive voltage dividing boards are arranged, stray capacitances occur between the resistive voltage dividing boards. A voltage higher than a designed value may be applied to the resistive voltage dividing boards because of imbalance in stray capacitance and thus break the components when a transient voltage change occurs. Such imbalance in stray capacitance thus needs to be reduced. Because the distances between the resistive voltage dividing boards need to be long in view of insulation design in order to reduce the stray capacitances between the resistive voltage dividing boards, the technology of Patent Literature 1 is disadvantageous in that the device configuration becomes large when a plurality of resistive voltage dividing boards are arranged.

The present invention has been made in view of the above, and an object thereof is to provide a voltage dividing device even having a plurality of resistive voltage dividing boards arranged with a small device configuration capable of achieving voltage division.

Solution to Problem

To solve the above problems and achieve the object, the present invention provides a voltage dividing device for dividing a voltage output from a voltage source, the voltage dividing device comprising a plurality of resistive voltage dividing boards each being a plate-like board having a first face, the board having a plurality of conductor patterns arranged on the first face, the conductor patterns being connected in series with one another through capacitors and resistors connected in parallel on the first face. The resistive voltage dividing boards are connected in series with one another through conductive members, and adjacent ones of the resistive voltage dividing boards are arranged such that a second face of one of the adjacent resistive voltage dividing boards and a first face of the other resistive voltage dividing board face each other, and that the conductor patterns arranged on a first face of the one resistive voltage dividing board are disposed oppositely from the conductor patterns arranged on the first face of the other resistive voltage dividing board with the other resistive voltage dividing board disposed therebetween.

Advantageous Effects of Invention

The present invention produces an effect of enabling voltage division by providing a small device configuration even having a plurality of resistive voltage dividing boards arranged.

DESCRIPTION OF EMBODIMENTS

Embodiments of a voltage dividing device according to the present invention will be described in detail below with reference to the drawings. Note that the present invention is not limited to the embodiments.

First Embodiment

Figure 1:
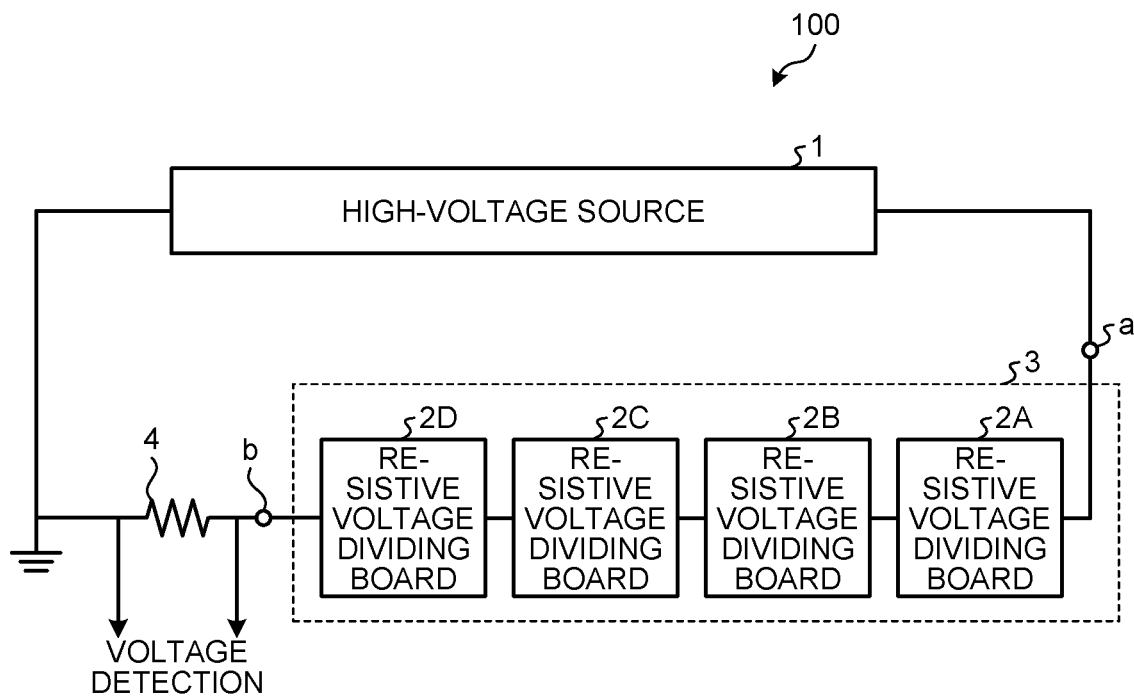
FIG. 1 is a diagram illustrating a configuration of a voltage detection system including a voltage dividing device according to a first embodiment.

FIG. 1 is a diagram illustrating a configuration of a voltage detection system including a voltage dividing device according to a first embodiment. The voltage detection system 100 includes a high-voltage source (voltage source) 1, a voltage dividing device (high-voltage dividing device) 3, and a sensing resistor 4. The high-voltage source 1 is a source of generation of high voltage. The voltage dividing device 3 divides high voltage generated by the high-voltage source 1. The sensing resistor 4 detects voltage for controlling the high-voltage source 1.

In the voltage detection system 100, the high-voltage source 1, the voltage dividing device 3, and the sensing resistor 4 are connected in series with one another. One end of the high-voltage source 1 is connected to one end of the voltage dividing device 3 via a connection point a. The opposite end of the voltage dividing device 3 is connected to one end of the sensing resistor 4 via a connection point b. The opposite end of the sensing resistor 4 is connected to the opposite end of the high-voltage source 1. A connection wire interconnecting the opposite end of the sensing resistor 4 and the opposite end of the high-voltage source 1 is grounded The high-voltage source 1 is a device that supplies high voltage to a load (which is not illustrated). The high-voltage source 1 controls a process of outputting voltage to the load on the basis of a voltage value detected by using the voltage dividing device 3 and the sensing resistor 4.

The voltage dividing device 3 includes a plurality of resistive voltage dividing boards for dividing voltage. While the description below is made as to the voltage dividing device 3 including four resistive voltage dividing boards 2A to 2D, the number of resistive voltage dividing boards included in the voltage dividing device 3 may be any number equal to or larger than two.

In the voltage dividing device 3, the resistive voltage dividing boards 2A to 2D are connected in series with one another. Specifically, the connection point a is connected to one end of the resistive voltage dividing board 2A. The opposite end of the resistive voltage dividing board 2A is connected to one end of the resistive voltage dividing board 2B. The opposite end of the resistive voltage dividing board 2B is connected to one end of the resistive voltage dividing board 2C. The opposite end of the resistive voltage dividing board 2C is connected to one end of the resistive voltage dividing board 2D. The opposite end of the resistive voltage dividing board 2D is connected to the connection point b.

Examples of the circuit system of the high-voltage source 1 include a boosting system using a transformer and a voltage doubler circuit system applied to a Cockcroft-Walton circuit or the like, and either of the circuit systems may be applied to the high-voltage source 1 of the present embodiment.

For example, assume that the high-voltage source 1 outputs a high voltage of 60 kV, and the sensing resistor 4 needs to detect 5 V. In this case, on the basis of the approach of resistive voltage division, the sensing resistor 4 needs to have 5 kΩ, and the voltage dividing device 3 needs to have a combined resistance of 60 MΩ. Because the voltage dividing device 3 includes four resistive voltage dividing boards 2A to 2D, the voltage is divided into about 15 kV per each of the resistive voltage dividing boards 2A to 2D. While 60 kV will be used in calculation and explanation below for describing electrical connections in the present embodiment, 60 kV is merely an example, and there is no upper limit and lower limit of the applicable voltage range.

Because the voltage dividing device 3 may be located at any position near the high-voltage source 1, the voltage dividing device 3 can be placed above, beneath, or on a lateral side face of the high-voltage source 1. In addition, the voltage dividing device 3 has no restrictions on fixing, and may thus be fixed in any direction at any angle. In the case where the voltage dividing device 3 is fixed near the high-voltage source 1, the voltage dividing device 3 may be fixed by a structure electrically having 0 V or an electrically floating structure.

Figure 2:
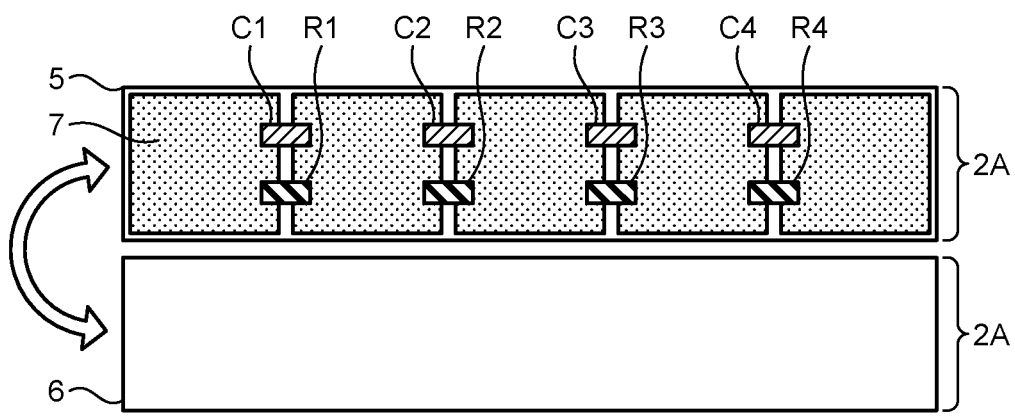
FIG. 2 is a diagram illustrating a configuration of resistive voltage dividing boards included in the voltage dividing device according to the first embodiment.
Figure 3:
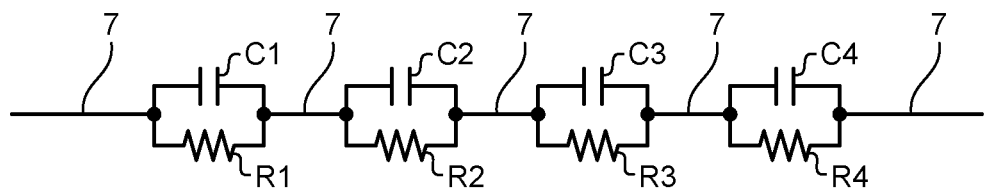
FIG. 3 is a diagram illustrating an equivalent circuit of the resistive voltage dividing board illustrated in FIG. 2.

FIG. 2 is a diagram illustrating a configuration of the resistive voltage dividing boards included in the voltage dividing device according to the first embodiment. FIG. 3 is a diagram illustrating an equivalent circuit of the resistive voltage dividing board illustrated in FIG. 2. Because the resistive voltage dividing boards 2A to 2D have configurations similar to each other, the configuration of the resistive voltage dividing board 2A will be described hereinbelow. FIG. 2 illustrates a configuration of a front face 5, and a configuration of a back or rear face 6. The front face is a first face of the resistive voltage dividing board 2A, and the rear face 6 is a second face of the resistive voltage dividing board 2A. Note that the front face 5 is illustrated with hatched areas.

In the first embodiment, the resistive voltage dividing boards 2A to 2D are single-sided boards each having copper patterns 7. The copper patterns 7, which are an example of conductor patterns, are arranged only on the front face 5. A plurality of copper patterns 7 is regularly arranged all over the front face 5 of the resistive voltage dividing board 2A in as large an area as possible with respect to the surface area of the front face 5. In the present embodiment, the copper patterns 7 that are regularly arranged all over the front face 5 in as large an area as possible are important, which copper patterns 7 generate stray capacitances with little error.

On the front face 5 of the resistive voltage dividing board 2A, a plurality of (five, for example) rectangular copper patterns 7 are connected in series with one another along the longitudinal direction of the resistive voltage dividing board 2A. In addition, on the front face 5 of the resistive voltage dividing board 2A, chip capacitors C1 to C4, which are an example of capacitors, and chip resistors R1 to R4, which are an example of resistors, are arranged between the copper patterns 7.

Note that, in the description below, the chip capacitors C1 to C4 included in the voltage dividing device 3 may each be referred to as a chip capacitor C0 when the chip capacitors C1 to C4 need not be individually identified. In addition, the chip resistors R1 to R4 included in the voltage dividing device 3 may each be referred to as a chip resistor R0 when the chip resistors R1 to R4 need not be individually identified.

The chip resistor R1 and the chip capacitor C1 are arranged between a first copper pattern 7 and a second copper pattern 7 such that the chip resistor R1 and the chip capacitor C1 interconnect the first copper pattern 7 and the second copper pattern 7. The chip resistor R1 and the chip capacitor C1 are connected in parallel to each other between the first copper pattern 7 and the second copper pattern 7.

The chip resistor R2 and the chip capacitor C2 are arranged between the second copper pattern 7 and a third copper pattern 7 such that the chip resistor R2 and the chip capacitor C2 interconnect the second copper pattern 7 and the third copper pattern 7. The chip resistor R2 and the chip capacitor C2 are connected in parallel to each other between the second copper pattern 7 and the third copper pattern 7.

The chip resistor R3 and the chip capacitor C3 are arranged between the third copper pattern 7 and a fourth copper pattern 7 such that the chip resistor R3 and the chip capacitor C3 interconnect the third copper pattern 7 and the fourth copper pattern 7. The chip resistor R3 and the chip capacitor C3 are connected in parallel to each other between the third copper pattern 7 and the fourth copper pattern 7.

The chip resistor R4 and the chip capacitor C4 are arranged between the fourth copper pattern 7 and a fifth copper pattern 7 such that the chip resistor R4 and the chip capacitor C4 interconnect the fourth copper pattern 7 and the fifth copper pattern 7. The chip resistor R4 and the chip capacitor C4 are connected in parallel to each other between the fourth copper pattern 7 and the fifth copper pattern 7.

As is discussed above, the copper patterns 7 are connected in series with each other via the chip capacitors C0 and the chip resistors R0 connected in parallel to each other on the front face 5 of the resistive voltage dividing board 2A. While the present embodiment is described giving four chip resistors R1 to R4 connected in series with each other and four chip capacitors C1 to C4 connected in series with each other for convenience of explanation, the number of series-connected chip resistors and the number of series-connected chip capacitors are not limited in the design of the resistive voltage dividing board 2A.

The distance between adjacent copper patterns 7 on the front face 5 of the resistive voltage dividing board 2A depend on the sizes of the chip capacitor C0 and the chip resistor R0 that are arranged on the board 2A. For example, when the chip capacitor C0 and the chip resistor R0 each have a size of 1.6 mm×0.8 mm (size 1608), the distance between adjacent copper patterns 7 can be 1.0 mm. On the front face 5 of the resistive voltage dividing board 2A, the chip capacitor C0 and the chip resistor R0 are placed, and the copper patterns 7 that are as large as possible with respect to the surface area of the front face 5 are then placed. For example, the gap between the upper side of the front face 5 and the upper sides of the copper patterns 7 is close to 0, and the gap between the lower side of the front face 5 and the lower sides of the copper patterns 7 is close to 0. In addition, the gap between the left side of the front face 5 and the left side of the leftmost one of the copper patterns 7 is close to 0, and the gap between the right side of the front face 5 and the right side of the rightmost one of the copper patterns 7 is close to 0.

Note that, because the resistive voltage dividing boards 2A to 2D are single-sided boards, none of copper patterns 7, chip capacitors C0, and chip resistors R0 are arranged on the rear faces 6 of the resistive voltage dividing boards 2A to 2D.

Figure 4:
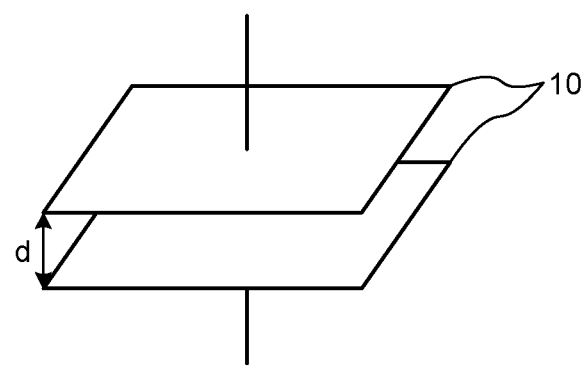
FIG. 4 is a diagram for explaining a capacitance of a capacitor.

A capacitance Cc [F] of a capacitor will now be described. FIG. 4 is a diagram for explaining the capacitance. FIG. 4 illustrates a configuration of a capacitor to be arranged in the chip capacitors C0 or the like. A capacitor arranged in the chip capacitors C0 or the like has a pair of two electrodes (parallel plates) 10 holding a dielectric of a permittivity ε therebetween.

The permittivity ε [F/m] is $\varepsilon = \varepsilon_0 \cdot \varepsilon_r$, where $\varepsilon_0$ represents permittivity in vacuum and $\varepsilon_r$ represents the relative permittivity of an individual substance. When the capacitance of the capacitor is Cc [F], the surface area of the electrodes 10 is S [mm$^2$], the distance between the electrodes 10 is d [mm], and the permittivity ε is ε [F/m], a formula Cc=ε·(S/d) [F] is satisfied. This formula shows that, when the permittivity ε [F/m] is constant, the capacitance Cc [F] is larger as the surface area S [mm$^2$] is larger, and the capacitance Cc [F] is larger as the distance d [mm] between the electrodes 10 is smaller. In addition, because the capacitance Cc [F] can be any value when the surface area S [mm$^2$] and the distance d [mm] between the electrodes 10 can be appropriately set, the capacitance Cc [F] can be set as intended even when the distance d [mm] is large.

Figure 5:
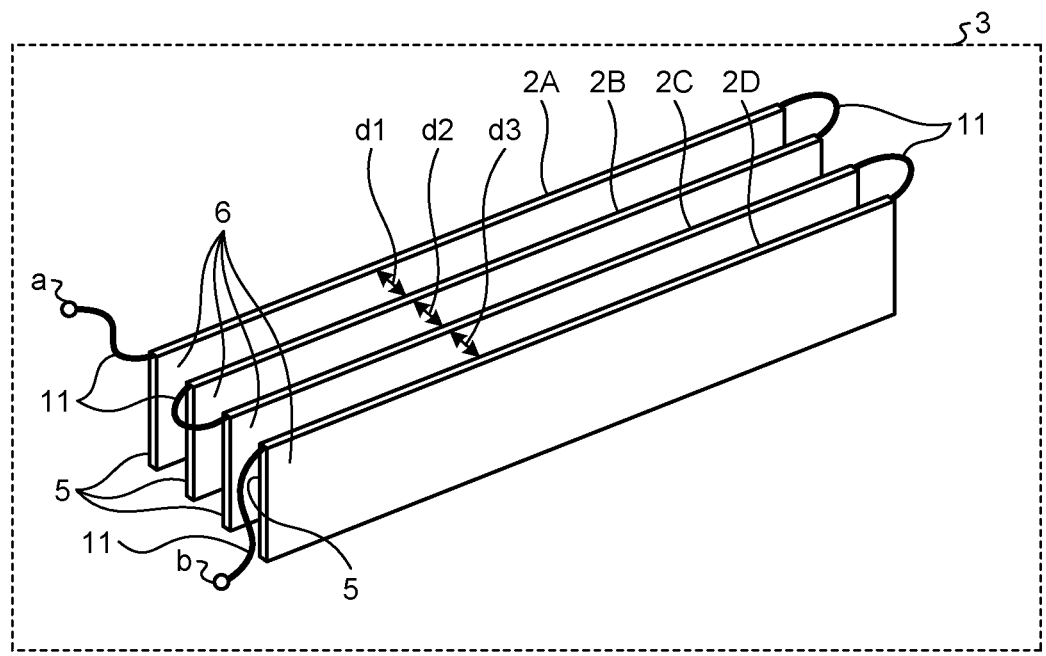
FIG. 5 is a diagram for explaining an implementation structure of the voltage dividing device according to the first embodiment.

FIG. 5 is a diagram for explaining an implementation structure of the voltage dividing device according to the first embodiment. The resistive voltage dividing boards 2A to 2D of the voltage dividing device 3 are connected in series with one another through connecting members 11 containing a conductive member. The method for interconnecting the resistive voltage dividing boards 2A to 2D may use any member that can electrically interconnect the resistive voltage dividing boards 2A to 2D. For example, wiring materials such as cable or metal conductors can be used for the connection between the resistive voltage dividing boards 2A to 2D.

The resistive voltage dividing boards 2A to 2D have plate-like shapes identical to one another. The front face 5 and the rear face 6 of each of the resistive voltage dividing boards 2A to 2D have rectangular shapes. The resistive voltage dividing boards 2A to 2D have their side faces including longitudinally extending side faces and laterally extending side faces. The resistive voltage dividing boards 2A to 2D stand in juxtaposition with the longitudinally extending side faces defining bottoms of the boards and the laterally extending side faces disposed in parallel in a vertical direction. The resistive voltage dividing boards 2A to 2D stand in juxtaposition such that the resistive voltage dividing boards 2A to 2D are in the same positions in the in-plane direction thereof with the front faces 5 thereof disposed in parallel to each other. That is to say, the resistive voltage dividing boards 2A to 2D stand in juxtaposition such that the resistive voltage dividing boards 2A to 2D are not offset from one another in the in-plane direction of the resistive voltage dividing boards 2A to 2D.

Note that the atmosphere environment under which the resistive voltage dividing boards 2A to 2D are arranged may be air, but an environment filled with dry air, nitrogen or hydrogen further produces an effect of reducing error in stray capacitances than that filled with air. Alternatively, an atmosphere environment under which the resistive voltage dividing boards 2A to 2D are arranged may be filled with sulfur hexafluoride (SF6), which produces an effect of reducing error in stray capacitances in a manner similar to the case of dry air.

Figure 6:
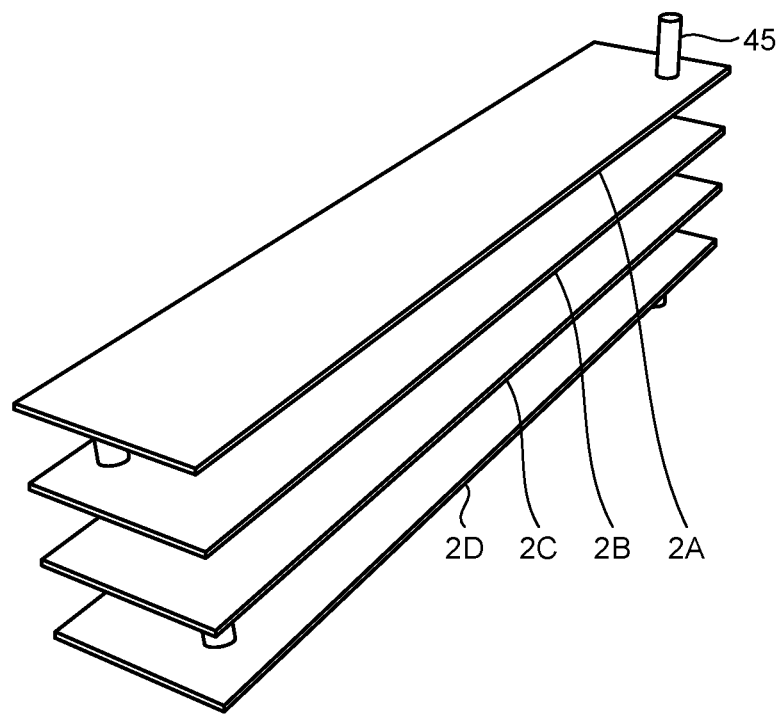
FIG. 6 is a diagram for explaining another example of implementation of the resistive voltage dividing boards according to the first embodiment.

FIG. 6 is a diagram for explaining another example of implementation of the resistive voltage dividing boards according to the first embodiment. Note that, in FIG. 6, the connecting members 11 are not illustrated. As illustrated in FIG. 6, the resistive voltage dividing boards 2A to 2D may be vertically stacked in layers. This case also produces an effect of reducing error in stray capacitances in a manner similar to the case of FIG. 5 in which the resistive voltage dividing boards 2A to 2D stand in juxtaposition. In the case where the resistive voltage dividing boards 2A to 2D are stacked in layers, the resistive voltage dividing boards 2A to 2D are supported by supporting members 45 or the like interposed therebetween.

The resistive voltage dividing board 2A is disposed with the rear face 6 of the resistive voltage dividing boards 2A facing the front face 5 of the resistive voltage dividing board 2B with a distance d1 therebetween. The resistive voltage dividing board 2B is disposed with the rear face 6 of the resistive voltage dividing board 2B facing the front face 5 of the resistive voltage dividing board 2C with a distance d2 therebetween. The resistive voltage dividing board 2C and the resistive voltage dividing board 2D are disposed with the rear face 6 of the resistive voltage dividing board 2C facing the front face 5 of the resistive voltage dividing board 2D with a distance d3 therebetween. That is to say, the resistive voltage dividing boards are arranged so that the rear face 6 of one resistive voltage dividing board and the front face 5 of another resistive voltage dividing board face each other, and that the copper patterns 7 arranged on the front face 5 of the one resistive voltage dividing board are disposed oppositely from the copper patterns 7 arranged on the front face 5 of the one resistive voltage dividing board with the other resistive voltage dividing board disposed therebetween.

Note that, in the description below, the resistive voltage dividing boards 2A to 2D may be referred to as boards. Thus, in the description below, "between the resistive voltage dividing boards 2A to 2D", that is, "between the resistive voltage dividing boards 2A and 2B", "between the resistive voltage dividing boards 2B and 2C", and "between the resistive voltage dividing boards 2C and 2D" may be referred to as "between the boards".

The resistive voltage dividing boards 2A to 2D of the voltage dividing device 3 are arranged so that the distances d1, d2, and d3 defined between the boards 2A and 2B, between the boards 2B and 2C, and between the boards 2C and 2*d*, respectively, are equal to one another. Thus, the resistive voltage dividing boards 2A to 2D are fixed at the same intervals, using spacers made of resin or the like, and wiring material are used for electrical connections between the boards, for example. Alternatively, the resistive voltage dividing boards 2A to 2D may be fixed at the same intervals with metal conductors alone, and electrically connected to one another through the metal conductors. Because the distances d1, d2, and d3 each defined between the adjacent boards have influence on the capacitance Cc [F] as described above, errors therein are preferably as small as possible, which may be within ±10%, for example.

Figure 7:
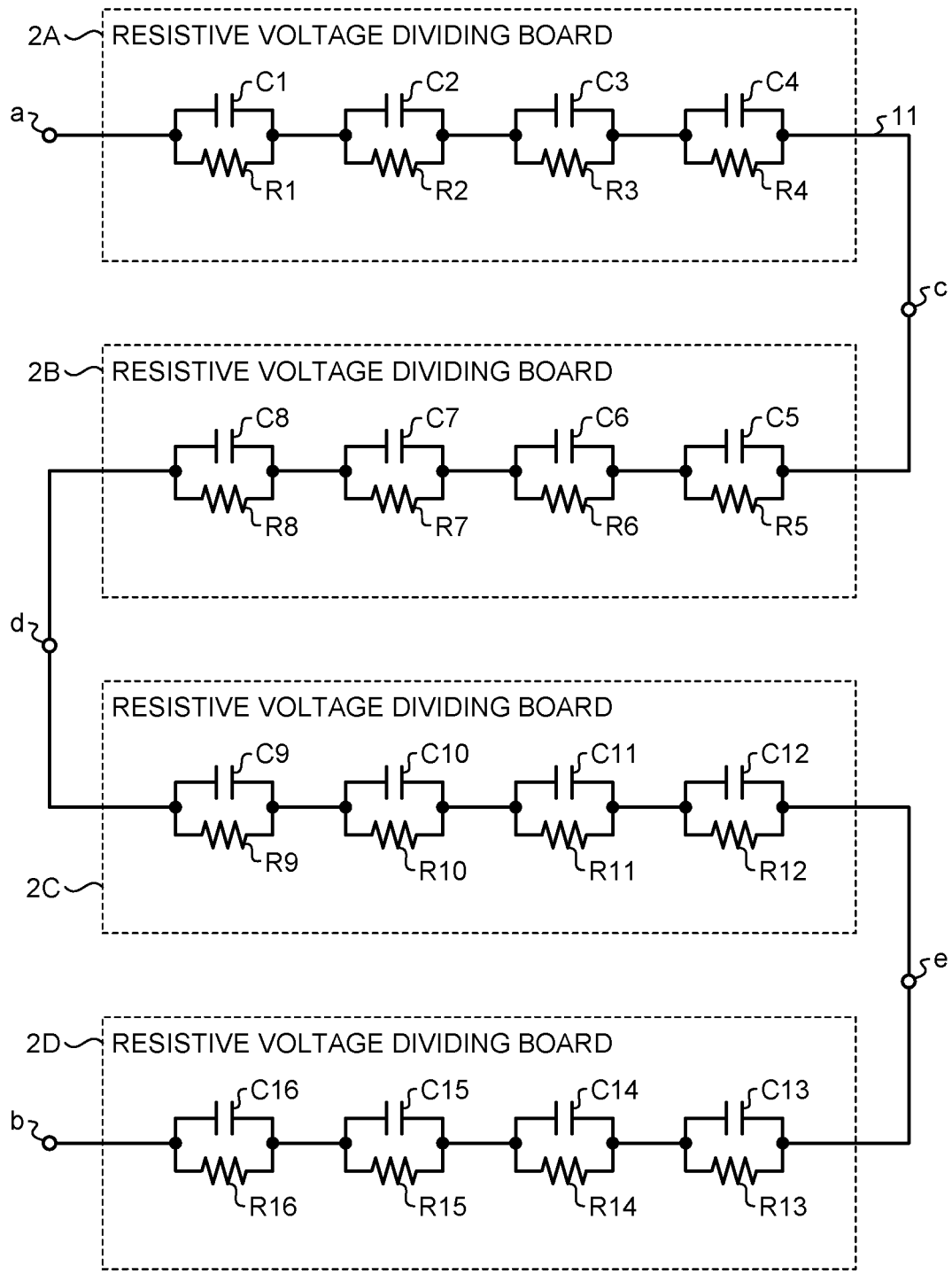
FIG. 7 is a diagram for explaining an ideal circuit in the case where the resistive voltage dividing boards included in the voltage dividing device according to the first embodiment are connected in series with one another.

A description will be made as to an ideal circuit of the voltage dividing device 3 with the resistive voltage dividing boards 2A to 2D connected in series with one another. FIG. 7 is a diagram for explaining an ideal circuit in the case where the resistive voltage dividing boards included in the voltage dividing device according to the first embodiment are connected in series with one another. While an ideal circuit is a circuit having no stray capacitances between the boards, a practical circuit has stray capacitances occurring between the boards.

The resistive voltage dividing board 2A includes chip capacitors C1 to C4 and chip resistors R1 to R4, and the resistive voltage dividing board 2B includes chip capacitors C5 to C8 and chip resistors R5 to R8. The resistive voltage dividing board 2C includes chip capacitors C9 to C12 and chip resistors R9 to R12, and the resistive voltage dividing board 2D includes chip capacitors C13 to C16 and chip resistors R13 to R16. The chip capacitors C1 to C16 have characteristics identical to each other, and the chip resistors R1 to R16 have characteristics identical to each other.

In the voltage dividing device 3, a chip capacitor CN (N is a natural number from 1 to 16) and a chip resistor RN are connected in parallel to each other. Assume that a combination of a chip capacitor CN and a chip resistor RN of the voltage dividing device 3 is referred to as an element pair XN. An element pair X1, an element pair X2, an element pair X3, an element pair X4, an element pair X5, an element pair X6, an element pair X7, an element pair X8, an element pair X9, an element pair X10, an element pair X11, an element pair X12, an element pair X13, an element pair X14, an element pair X15, and an element pair X16 are arranged in this order with the element pairs X1 to X16 connected in series with one another.

As described above, in the resistive voltage dividing boards 2A to 2D, each of the chip capacitors C0 and the corresponding one of the chip resistors R0 are connected in parallel to each other, and the pairs of chip capacitor C0 and chip resistor R0 are connected in series with one another.

The element pair X1 of the resistive voltage dividing board 2A is connected to the connection point a. The element pair X4 of the resistive voltage dividing board 2A and the element pair X5 of the resistive voltage dividing board 2B are connected to each other via a connection point c. The element pair X8 of the resistive voltage dividing board 2B and the element pair X9 of the resistive voltage dividing board 2C are connected to each other via a connection point d. The element pair X12 of the resistive voltage dividing board 2C and the element pair X13 of the resistive voltage dividing board 2D are connected to each other via a connection point e. In addition, the element pair X16 of the resistive voltage dividing board 2D is connected to the connection point b.

In the voltage dividing device 3, the element pairs X1 to X16 arranged on the resistive voltage dividing boards 2A to 2D are connected in series with one another. In the case of the ideal circuit, no stray capacitances occur between the boards. In the ideal circuit, thus, voltage applied between the connection point a and the connection point b is equally divided out between the individual pairs of chip capacitor C0 and chip resistor R0 (between the individual element pairs). When a voltage of 60 kV is applied between the connection point a and the connection point b, a voltage of 3.75 kV is applied to each of the chip capacitors C0 and the chip resistors R0. In the case of the ideal circuit, thus, only the voltage of 3.75 kV needs to be considered in design of the boards.

A voltage of 30 kV, which is a multiple of the number of series-connected pairs of chip capacitors C0 and chip resistors R0 (i.e., eight times, in this case) arranged between the connection points a-d, is applied between the connection points a-d. Similarly, 30 kV is applied between the connection points d-b and between the connection points c-e. In the case of the ideal circuit, thus, the implementation structure may be designed on the assumption that a maximum of 30 kV is applied between the boards.

Figure 8:
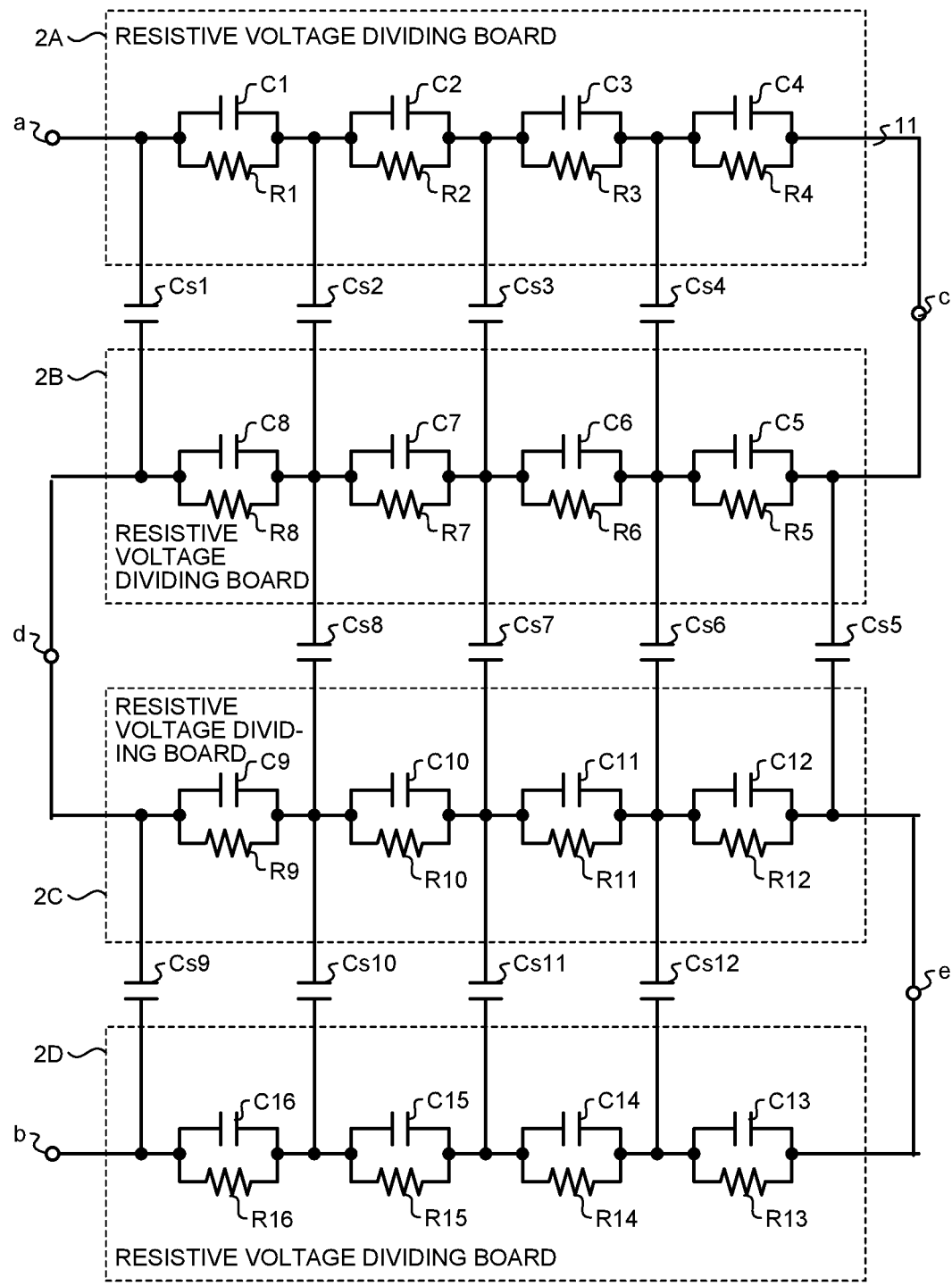
FIG. 8 is a diagram for explaining an actual circuit in the case where the resistive voltage dividing boards included in the voltage dividing device according to the first embodiment are connected in series with one another.

In a practical circuit of the voltage dividing device 3, however, stray capacitances (stray capacitances Cs1 to Cs12 to be described later) are present between the boards. A practical circuit of the voltage dividing device 3 in view of the stray capacitances will be described. FIG. 8 is a diagram for explaining an actual circuit in the case where the resistive voltage dividing boards included in the voltage dividing device according to the first embodiment are connected in series with one another.

Unintended stray capacitances occur in the voltage dividing device 3. A description will be made here as to stray capacitances Cs1 to Cs12 present between the boards of the voltage dividing device 3. The stray capacitances Cs1 to Cs4 are stray capacitances between the resistive voltage dividing boards 2A and 2B, the stray capacitances Cs5 to Cs8 are stray capacitances between the resistive voltage dividing boards 2B and 2C, and the stray capacitances Cs9 to Cs12 are stray capacitances between the resistive voltage dividing boards 2C and 2D.

The capacitance values [F] of the stray capacitances Cs1 to Cs12 vary from stray capacitance to stray capacitance unless the stray capacitances Cs1 to Cs12 are appropriately controlled. Different capacitance values of the stray capacitances Cs1 to Cs12 change the division ratio due to the stray capacitances Cs1 to Cs12 between the boards when a transient voltage change occurs. For this reason, a high voltage higher than a designed value may be applied between the connection points a-d, between the connection points d-b, and between the connection points c-e, and the voltage dividing device 3 may fail unless the stray capacitances Cs1 to Cs12 are appropriately controlled. These stray capacitances Cs1 to Cs12 are not structurally eliminated. All of the stray capacitances Cs1 to Cs12 are therefore controlled such that the stray capacitances Cs1 to Cs12 have common values, thereby bringing the division ratio due to the stray capacitances Cs1 to Cs12 between the boards, closer to a given value. Note that, in the description below, the stray capacitances Cs1 to Cs12 may be referred to as stray capacitances CsX when the stray capacitances Cs1 to Cs12 need not be distinguished from each other.

A description will be made as to the capacitance values [F] of the stray capacitances Cs1 to Cs12 in a case where the resistive voltage dividing boards 2A to 2D, which are single-sided boards, are mounted as illustrated in FIG. 5.

Figure 9:
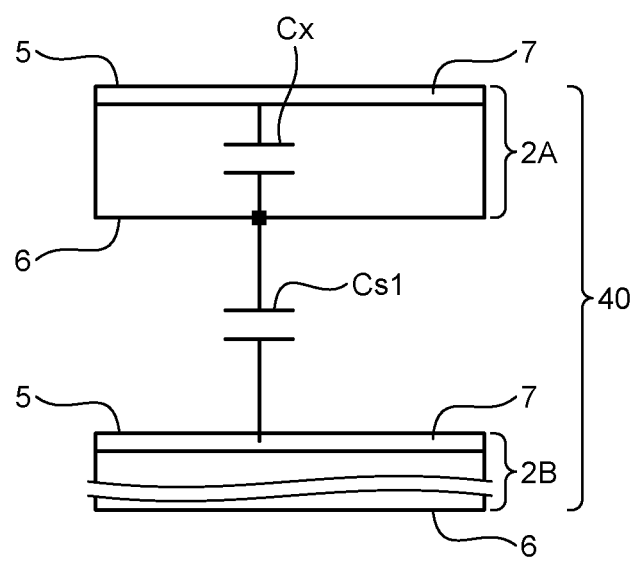
FIG. 9 is a diagram for explaining a stray capacitance occurring between resistive voltage dividing boards illustrated in FIG. 8.

FIG. 9 is a diagram for explaining stray capacitances occurring between the resistive voltage dividing boards illustrated in FIG. 8. Note that the capacitance values [F] of the stray capacitances Cs1 to Cs12 can be calculated on the basis of similar approaches, and the capacitance value [F] of the stray capacitance Cs1 will thus be explained here.

FIG. 9 illustrates a first unit 40 that is part of the resistive voltage dividing boards 2A and 2B. The first unit 40 is located at a position where the stray capacitance Cs1 illustrated in FIG. 8 occurs. In the present embodiment, as illustrated in FIG. 9, the capacitance Cx of a board material, and the stray capacitance Cs1 between the resistive voltage dividing boards 2A and 2B are connected in series with each other to thereby provide the stray capacitance of the first unit 40. The capacitance Cx of the board material and the stray capacitance Cs1 between the resistive voltage dividing boards 2A and 2B in the implementation structure of the present embodiment will now be explained. A glass composite board (CEM-3), which is a typical board material, has a relative permittivity $\varepsilon_r$ of 4.7, and a glass epoxy board (FR-4) has a relative permittivity $\varepsilon_r$ of 4.73. The capacitance value [F] in a case where the board material is CEM-3 will be herein explained.

Assume that the resistive voltage dividing boards 2A and 2B each have a thickness of 1.6 mm. In addition, assuming that the surface area of the copper patterns 7 is S [mm$^2$], the capacitance Cx of the board material is C=$\varepsilon_0 \cdot \varepsilon_r$ (S/d), that is, 2.94$\varepsilon_0$S [F].

Next, the stray capacitance Cs1 between the boards will be explained. In the implementation structure of the present embodiment, assume that the distance between the boards is from 10 mm to 20 mm and the environment under which the voltage dividing device 3 is located is an atmosphere with a relative permittivity of $\varepsilon_r$=1. In this case, the stray capacitance Cs1 between the boards is 0.1$\varepsilon_0$S [F] when the distance between the boards is 10 mm, and 0.05$\varepsilon_0$S [F] when the distance between the boards is 20 mm. In the case where the stray capacitance of the first unit 40 is provided by the capacitance Cx of the board material and the stray capacitance Cs1 between the boards, thus, only about a few % of the whole voltage is applied to the capacitance Cx of the board material in accordance with the theory of voltage division of capacitors. The remaining voltage is therefore applied to the stray capacitance Cs1 between the boards. This means that in the present embodiment, the stray capacitance of the first unit 40 depends on the stray capacitance Cs1 between the boards.

Figure 10:
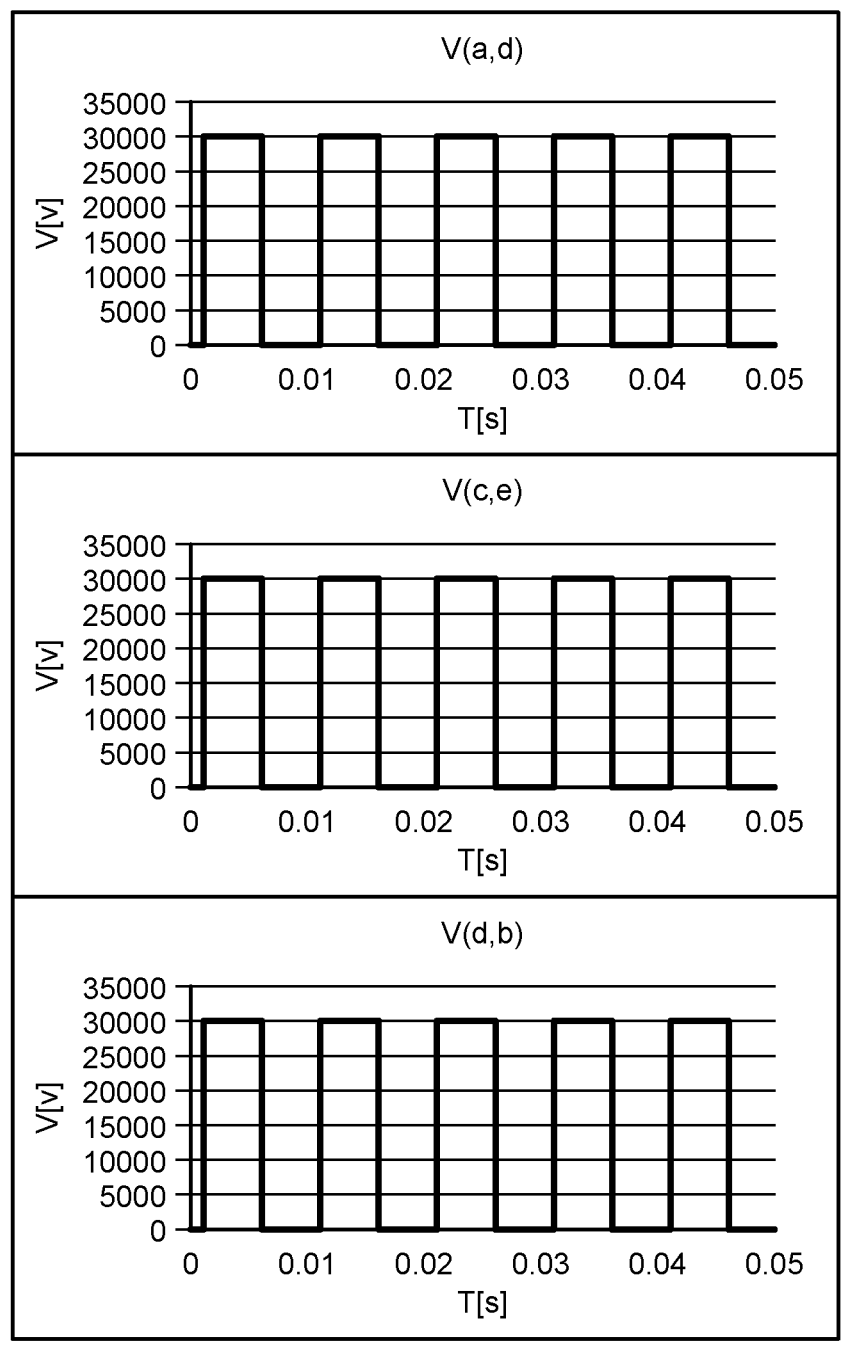
FIG. 10 is a chart illustrating a result of simulation analysis of stray capacitances in the voltage dividing device according to the first embodiment.
Figure 11:
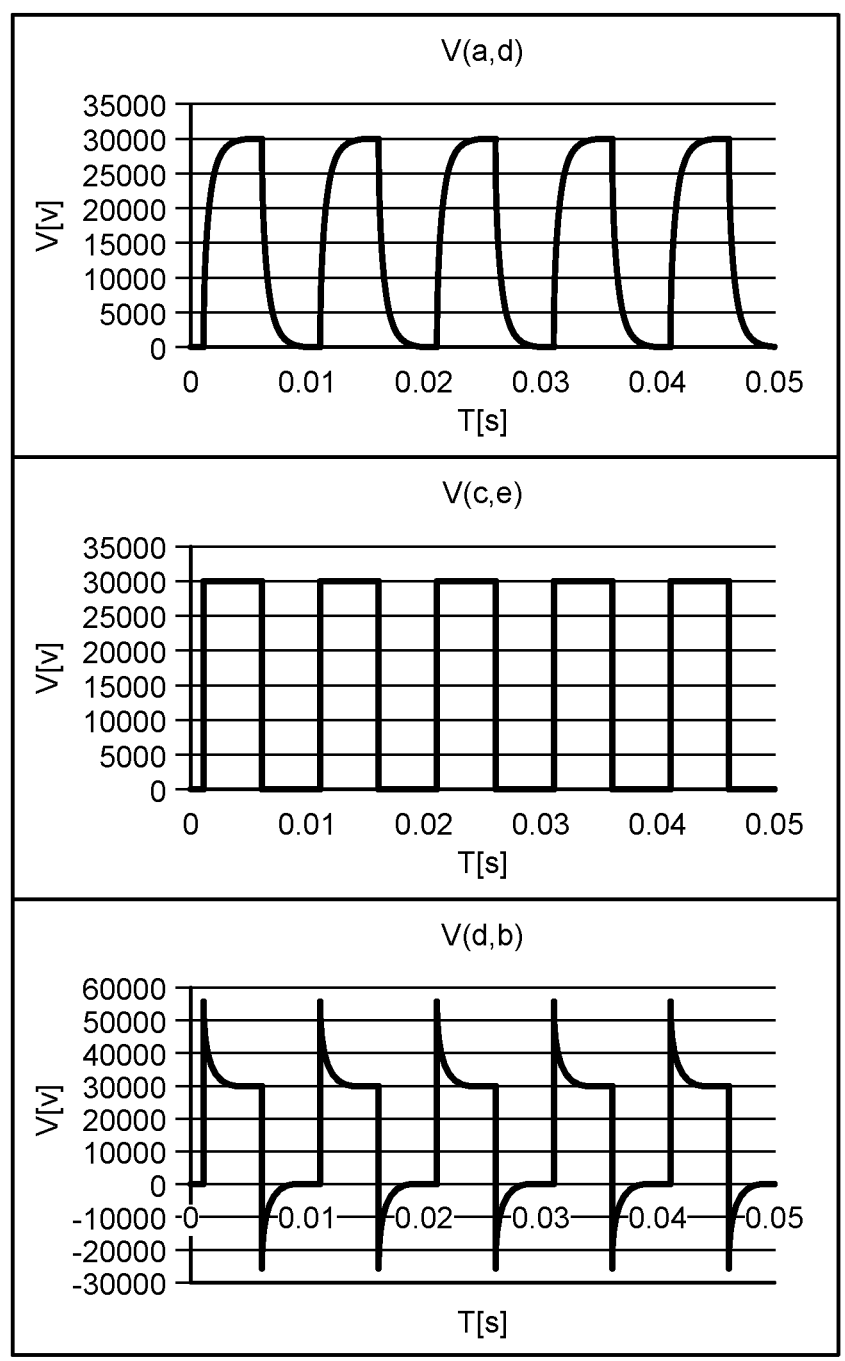
FIG. 11 is a chart illustrating a result of simulation analysis in a case where stray capacitances between boards differ from one another.

Next, a result of simulation analysis of the stray capacitances in the circuit illustrated in FIG. 8 will be explained. FIG. 10 is a chart illustrating a result of simulation analysis of the stray capacitances in the voltage dividing device according to the first embodiment. FIG. 10 illustrates a result of simulation analysis in a case where the stray capacitances Cs1 to Cs12 between the boards are equal to one another. FIG. 11 is a chart illustrating a result of simulation analysis in a case where the stray capacitances between boards differ from one another.

A simulation condition used here is application of a voltage of 60 kV and 100 Hz between the connection points a-b illustrated in FIG. 8. Upper parts of FIGS. 10 and 11 each illustrate a voltage waveform between the connection points a-d illustrated in FIG. 8. Middle parts of FIGS. 10 and 11 each illustrate a voltage waveform between the connection points c-e illustrated in FIG. 8. Lower parts of FIGS. 10 and 11 each illustrate a voltage waveform between the connection points d-b illustrated in FIG. 8.

The voltage waveforms illustrated in FIG. 10 are those in the case where all of the stray capacitances Cs1 to Cs12 are equal to one another as in the voltage dividing device 3 of the present embodiment. As illustrated in FIG. 10, in the case where all of the stray capacitances Cs1 to Cs12 are equal to one another, 30 kV is evenly applied across every adjacent boards. This is because errors in the stray capacitances Cs1 to Cs12 have very small and substantially equal values, and voltage division due to the stray capacitances Cs1 to Cs12 is evenly made even on a transient voltage change. Thus, in the present embodiment, in addition to even voltage application across the boards, 3.75 kV resulting from the division of the voltage applied to the boards is applied to each of the chip capacitors C0 and the chip resistors R0 on the board. It is therefore possible to prevent a failure of the voltage dividing device 3.

The voltage waveforms illustrated in FIG. 11 are those of a voltage dividing device in a comparative example. In the voltage dividing device of the comparative example, the stray capacitances Cs1 to Cs4 between connection points a-d are larger than the stray capacitances Cs5 to Cs12. In the voltage dividing device of the comparative example, that is to say, the stray capacitances Cs1 to Cs4 differ from the stray capacitances Cs5 to Cs12.

As illustrated in FIG. 11, a maximum of 30 kV is applied between the connection points a-d and between the connection points c-e, and a maximum of 58 kV is applied between the connection points d-b. This is a result of application of a larger voltage to the stray capacitances CsX of smaller capacitance values as the division ratio due to the stray capacitances CsX changes because the different stray capacitances CsX are connected in series with one another in the voltage dividing device 3. In view of such a result, the voltage dividing device of the comparative example needs to be designed to provide an implementation structure that withstands 58 kV. Assuming that a spatial insulation distance is 1 kV/mm, the implementation structure of the voltage dividing device of the comparative example needs to have the distance of 58 mm between the boards. In addition, voltages higher than designed values are applied to the chip capacitors C0 and the chip resistors R0 on the boards, which is a cause of damage of components.

Note that, in the simulation explained in FIG. 11, only the stray capacitances Cs1 to Cs4 between the connection points a-d are changed for the purpose of making the simulation easy to understand, which is merely an example of simulation. In practical board design for the voltage dividing device of the comparative example, the pattern design in which the stray capacitances between boards have equal values as in the present embodiment is not used.

In the voltage dividing device 3 of the present embodiment, the single-sided boards, each of which includes evenly arranged copper patterns 7 equivalent to the surface area S [mm$^2$] of the front face 5 thereof, are juxtaposed with the equal distances d1, d2, and d3 each defined between the adjacent boards such that the boards are not offset from one another in the plane direction. As a result, the voltage dividing device 3 can be controlled so that the stray capacitances CsX between the boards have equal values at all the positions between the boards. Voltage can be thus evenly divided between boards even during a transient voltage change, which facilitates design of insulation distances between boards and enables reduction in size of the voltage dividing device 3. In other words, the smaller-sized voltage dividing device 3 with sufficient insulation distances between components can be achieved.

In addition, errors in mechanical dimensions of boards occur in manufacture of the boards. Board having small surface areas of copper patterns, i.e., boards of the pattern design not taking account of the surface area S [mm$^2$] of the front face 5 thereof widely varies in stray capacitance because of the errors in the mechanical dimension. In addition, the boards having the small surface areas of copper patterns provide the small capacitance values of the stray capacitances. In the case of boards with small surface areas of copper patterns, thus, the capacitance values of the stray capacitances are such a very small value as a few pF. Increasing the number of such boards having small surface areas of copper patterns in order to divide high voltage are more likely to cause imbalance in stray capacitances. As a result, the imbalance in voltage becomes large, thereby making it difficult to estimate voltages between the boards.

In the voltage dividing device 3 of the present embodiment, the surface area of the copper patterns 7 is as large as possible with respect to the surface area S [mm$^2$] of the front face 5. For this reason, variation in the stray capacitances CsX due to errors (manufacturing errors) in the dimensions of the copper patterns 7 is allowable.

A description will be made as to an example in which the copper patterns each having a width of 2 mm overlie each other. In a case where the position of a copper pattern on one of adjacent boards is shifted widthwise (laterally) by 1 mm because of errors in the mechanical dimensions of the boards, the width of the lateral overlapping portions of the copper patterns having the width of 2 mm is 1 mm. In this case, the stray capacitance between the copper patterns is half the designed value. In a case where copper patterns each having a width of 10 mm overlie each other with the position of one of the copper patterns shifted widthwise by 1 mm, the width of the lateral overlapping portions of the copper patterns is 9 mm. In this case, the stray capacitance between the copper patterns is 90% of the designed value. This means that the larger the surface areas of the copper patterns are, the more allowable the error (misalignment) in the dimensions of the copper patterns is.

While the present embodiment has been described giving a configuration that divides a voltage of 60 kV with the series-connected the resistive voltage dividing boards 2A to 2D, the resistive voltage dividing boards 2A to 2D are merely an example. Thus, the number of resistive voltage dividing boards can be changed depending on a device to be applied, voltage, or the like. For example, the number of series-connected resistive voltage dividing boards may be increased to divide a voltage higher than 60 kV, in which case the resistive voltage dividing boards should also be arranged at equal distances between the resistive voltage dividing boards such that the resistive voltage dividing boards are not offset from one another in the plane direction thereof.

In the first embodiment, as described above, the resistive voltage dividing boards 2A to 2D are connected in series with one another through the connecting members 11, and adjacent resistive voltage dividing boards are arranged in parallel to each other such that the rear face 6 of one of the adjacent resistive voltage dividing boards and the front face 5 of the other resistive voltage dividing board face each other. Furthermore, the resistive voltage dividing boards 2A to 2D are arranged at equal distances each of which is defined between the rear face 6 of one of adjacent resistive voltage dividing boards and the front face 5 of the other of the adjacent resistive voltage dividing boards. As a result, all the stray capacitances Cs1 to Cs12 can be controlled such that the stray capacitances Cs1 to Cs12 have common values, and the division ratio due to the stray capacitances Cs1 to Cs12 between the boards can come close to a given value. The voltage dividing device 3 having even a plurality of resistive voltage dividing boards arranged can thus provide a small device configuration capable of achieving the voltage division.

In addition, each of the resistive voltage dividing boards 2A to 2D has the evenly arranged copper patterns 7 having the substantially the same area as the surface area S [mm$^2$] of the front face 5 thereof. This improves the heat dissipation performance of the resistive voltage dividing boards 2A to 2D. In addition, the resistive voltage dividing boards 2A to 2D vertically stand in juxtaposition, which improves the air flow and improves heat dissipation through natural convection. A rise in temperature of the resistive voltage dividing boards 2A to 2D can therefore be curbed even in an environment under which the voltage dividing device 3 is installed in a sealed structure that cannot be forcibly air-cooled or water-cooled.

Second Embodiment

Next, a second embodiment of the invention will be described with reference to FIGS. 12 to 16. In the second embodiment, resistive voltage dividing boards are double-sided boards including copper patterns 7 arranged on both faces thereof.

Figure 12:
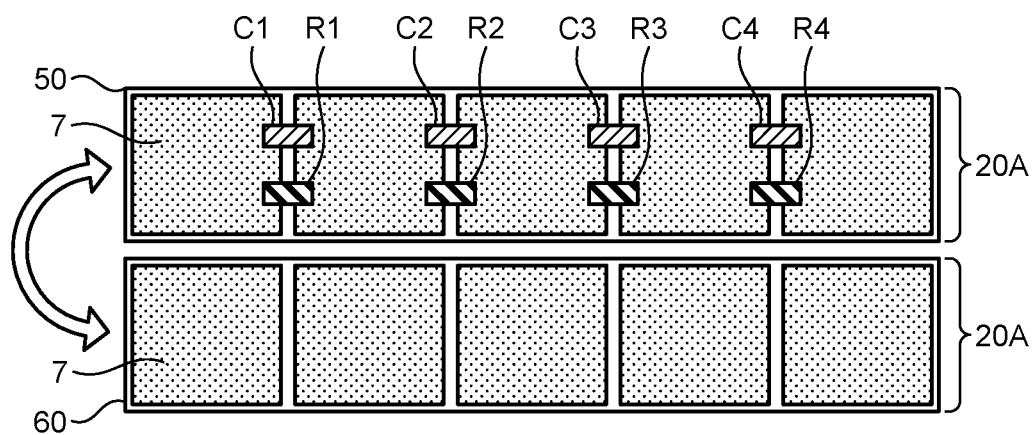
FIG. 12 is a diagram illustrating a configuration of resistive voltage dividing boards included in a voltage dividing device according to a second embodiment.

FIG. 12 is a diagram illustrating a configuration of resistive voltage dividing boards included in a voltage dividing device according to the second embodiment. In the second embodiment, a resistive voltage dividing board 20A, which is a double-sided board, is used instead of the resistive voltage dividing board 2A that is a single-sided board. Note that the voltage dividing device 3 according to the second embodiment includes the other resistive voltage dividing boards than the resistive voltage dividing board 20A that have configurations similar to that of the resistive voltage dividing board 20A.

The resistive voltage dividing board 20A is a double-sided board including copper patterns 7 arranged on both faces thereof. A front face 50 of the resistive voltage dividing board 20A has a configuration similar to that of the front face 5 of the resistive voltage dividing board 2A. Specifically, a plurality of copper patterns 7 regularly arranged on the front face 50 of the resistive voltage dividing board 20A has as large an area as possible with respect to the surface area S [mm$^2$] of the front face 50. In addition, chip capacitors C1 to C4 and chip resistors R1 to R4 are arranged between the copper patterns 7 on the front face 50 of the resistive voltage dividing board 20A as in the front face 5 of the resistive voltage dividing board 2A.

Copper patterns 7 are positioned on a rear face 60 of the resistive voltage dividing board 20A in plane-symmetric relation with those on the front face 50 of the resistive voltage dividing board 20A. Specifically, the copper patterns 7 having the same shapes and the same sizes as those on the front face 50 of the resistive voltage dividing board 20A are arranged on the rear face 60 of the resistive voltage dividing board 20A oppositely from the copper patterns 7 on the front face 50. The copper patterns 7 arranged on the rear face 60 are each electrically connected through a via (a via 17 as will be described later) to one of the copper patterns 7 arranged on the front face 50 in the plane-symmetric relation thereto. Specifically, the leftmost copper pattern 7 on the front face 50 and the leftmost copper pattern 7 on the rear face 60 are connected to each other through a via 17. The second copper pattern 7 from the left on the front face 50 and the second copper pattern 7 from the left on the rear face 60 are connected to each other through a via 17. In addition, the rightmost copper pattern 7 on the front face 50 and the rightmost copper pattern 7 on the rear face 60 are connected to each other through a via 17. The second copper pattern 7 from the right on the front face 50 and the second copper pattern 7 from the right on the rear face 60 are connected to each other through a via 17.

The implementation structure of the voltage dividing device 3 according to the second embodiment is the same as that of the voltage dividing device 3 according to the first embodiment illustrated in FIG. 5, and the description thereof will thus not be repeated. In a practical circuit of a total of four series-connected resistive voltage dividing boards similar to the resistive voltage dividing board 20A, the stray capacitances Cs1 to Cs12 are present between the boards as in the circuit of the voltage dividing device 3 according to the first embodiment illustrated in FIG. 8.

In the voltage dividing device 3 of the second embodiment, the resistive voltage dividing board 20A is located at the position of the resistive voltage dividing boards 2A, and a resistive voltage dividing board 20B, which will be described later, is located at the position of the resistive voltage dividing board 2B. In addition, a resistive voltage dividing board similar to the resistive voltage dividing board 20A is located at the position of the resistive voltage dividing board 2C, and a resistive voltage dividing board similar to the resistive voltage dividing board 20A is located at the position of the resistive voltage dividing board 2D.

Because different capacitance values of the stray capacitances Cs1 to Cs12 may cause failure of the voltage dividing device 3, as explained in the first embodiment, the stray capacitances Cs1 to Cs12 are also controlled so that all the stray capacitances Cs1 to Cs12 have equal values in the second embodiment as in the first embodiment. Note that an equivalent circuit of the resistive voltage dividing board 20A illustrated in FIG. 12 is similar to those of the resistive voltage dividing boards 2A to 2D illustrated in FIG. 2.

A description will be made as to the capacitance values [F] of the stray capacitances Cs1 to Cs12 in a case where four resistive voltage dividing boards, which are double-sided boards, are mounted as illustrated in FIG. 5.

Figure 13:
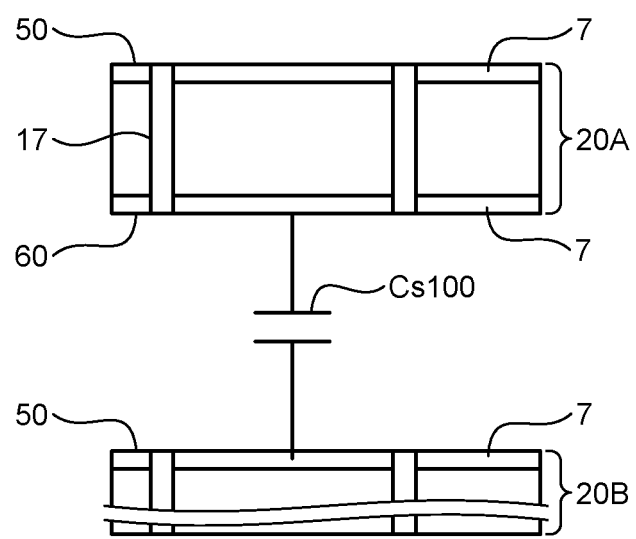
FIG. 13 is a diagram for explaining a stray capacitance occurring between resistive voltage dividing boards included in the voltage dividing device according to the second embodiment.

FIG. 13 is a diagram for explaining a stray capacitance occurring between the resistive voltage dividing boards included in the voltage dividing device according to the second embodiment. Note that the capacitance values [F] of the stray capacitances Cs1 to Cs12 can be calculated on the basis of similar approaches, and the capacitance value [F] of the stray capacitance Cs1 will thus be explained here.

The resistive voltage dividing board 20A and 20B included in the voltage dividing device 3 of the second embodiment are connected in series with each other through a connecting member 11 (which is not illustrated in FIG. 13). The voltage dividing device 3 of the second embodiment differs from the voltage dividing device 3 of the first embodiment in that the type of board of the voltage dividing device 3 of the second embodiment, which is a double-sided board, has the copper patterns 7 arranged on both faces thereof such that the copper patterns 7 on a front face 50 are connected through the vias 17 to the copper patterns 7 on a rear face 60.

Because this configuration has no capacitance Cx of the board material, only the stray capacitances CsX between the boards may be considered in the second embodiment. A stray capacitance Cs100 between the boards illustrated in FIG. 13 can be obtained by calculation similar to that for the stray capacitance Cs1 between the boards in the first embodiment. Specifically, assume that the distance between the boards is from 10 mm to 20 mm and the environment under which the voltage dividing device 3 is located is an atmosphere with a relative permittivity of $\varepsilon_r=1$. In this case, the stray capacitance Cs100 between the boards is $0.1\varepsilon_0 S$ [F] when the distance between the boards is 10 mm, and $0.05\varepsilon_0 S$ [F] when the distance between the boards is 20 mm.

Because double-sided boards are used in the voltage dividing device 3 according to the second embodiment, as described above, the implementation structure of the voltage dividing device 3 may be designed considering only the stray capacitances CsX between the boards as the stray capacitances in the voltage dividing device 3. As a result, the design of the implementation structure of the voltage dividing device 3 is facilitated as compared with the voltage dividing device 3 of the first embodiment.

Because the copper patterns 7 regularly arranged on both of the front face 50 and the rear face 60 of each board in the second embodiment have as large an area as possible with respect to the surface area S [mm$^2$] of the board, the surface area of the copper patterns 7 is twice that in the first embodiment. The heat dissipation performance of the boards is therefore improved as compared with that of the voltage dividing device 3 of the first embodiment.

Furthermore, the corners of the copper patterns 7 that are closest to the corners of the resistive voltage dividing boards 20A to 20D may be rounded off, so that the electric fields are alleviated and discharge from the resistive voltage dividing boards 20A to 20D is reduced.

Figure 14:
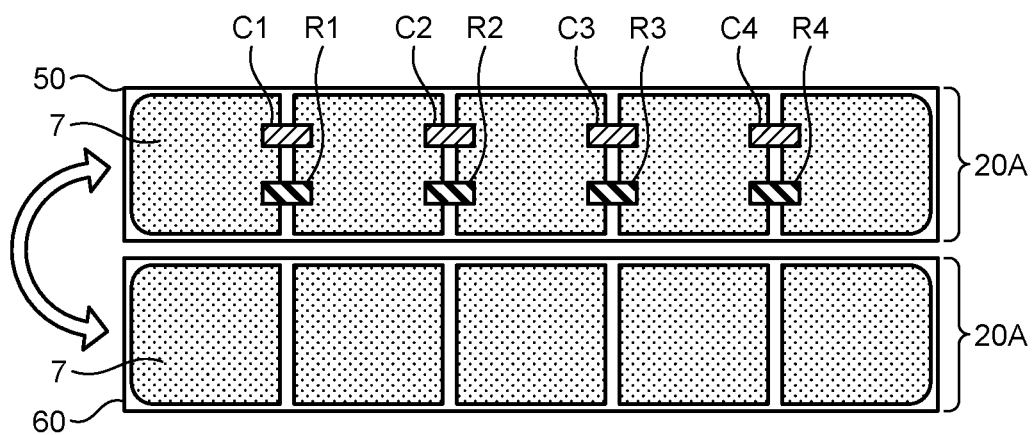
FIG. 14 is a diagram illustrating another example of a configuration of the resistive voltage dividing boards included in the voltage dividing device according to the second embodiment.

FIG. 14 is a diagram illustrating another example of a configuration of resistive voltage dividing boards included in a voltage dividing device according to the second embodiment. Because the resistive voltage dividing boards 20A to 20D have configurations similar to each other, another example of the configuration of the resistive voltage dividing board 20A will be described here. As illustrated in FIG. 14, the corners of the copper patterns 7 that are closest to the corners of the resistive voltage dividing board 20A are rounded off to thereby alleviate the electric field, and reduce discharge from the resistive voltage dividing board 20A. Alternatively, the corners of all the copper patterns 7 of the resistive voltage dividing board 20A may be rounded off. Thus, the corners of all the copper patterns 7 of the resistive voltage dividing boards 20A to 20D may be rounded off.

Figure 15:
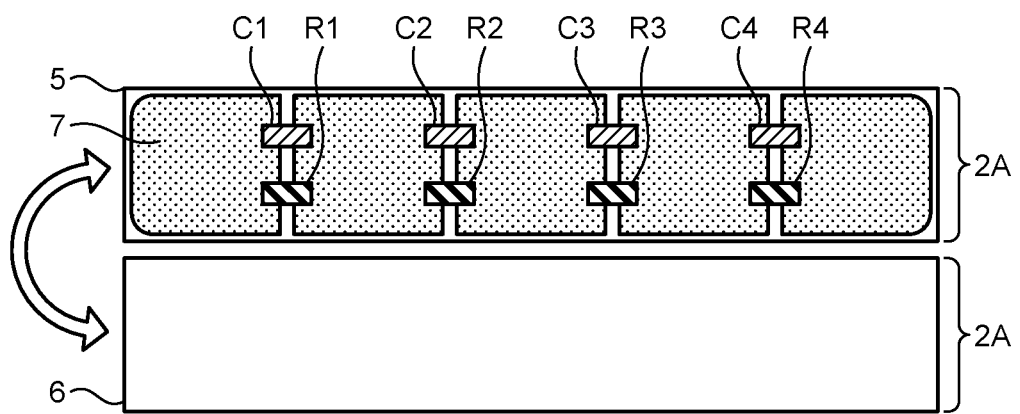
FIG. 15 is a diagram illustrating another example of a configuration of resistive voltage dividing boards included in the voltage dividing device according to the first embodiment.

In addition, the copper patterns 7 of single-sided boards may be rounded off. In this case, the corners of the copper patterns 7 that are closest to the corners of the resistive voltage dividing boards 2A to 2D described in the first embodiment are rounded off. FIG. 15 is a diagram illustrating another example of a configuration of resistive voltage dividing boards included in the voltage dividing device according to the first embodiment. As illustrated in FIG. 15, the corners of the copper patterns 7 that are closest to the corners of the resistive voltage dividing board 2A are rounded off to thereby alleviate the electric field, and reduce discharge from the resistive voltage dividing board 2A. Alternatively, the corners of all the copper patterns 7 of the resistive voltage dividing boards 2A to 2D may be rounded off.

The effect of reducing discharge by rounding off of the corners of the copper patterns 7 is more significant in the case of the resistive voltage dividing boards 20A to 20D, which are double-sided boards than in the case of the resistive voltage dividing boards 2A to 2D, which are single-sided boards.

Figure 16:
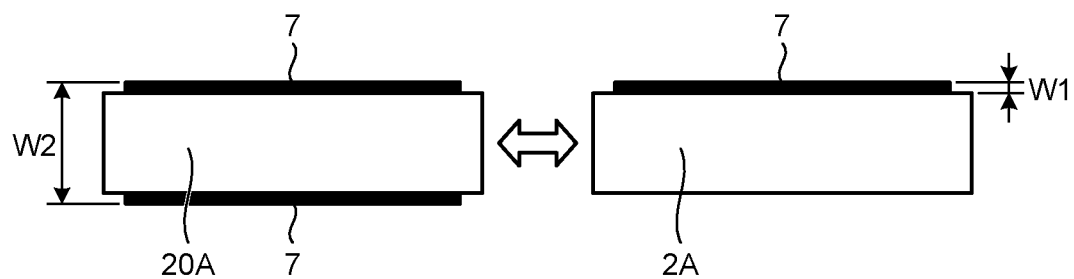
FIG. 16 is a diagram for explaining the relation between the thickness of resistive voltage dividing boards and a discharge reducing effect.

FIG. 16 is a diagram for explaining the relation between the thickness of the resistive voltage dividing boards and the discharge reducing effect. For example, assume that the resistive voltage dividing boards 2A and 20A each have a thickness of 1.6 mm, and the copper patterns 7 each have a thickness of 35 μm. In this case, the voltages across the opposite copper patterns 7 on the front face and the rear face of the resistive voltage dividing board 20A, which is a double-sided board, are equal to each other. Thus, the resistive voltage dividing board 20A, which can have the same characteristics as that of a mass of conductor having a thickness corresponding to the thickness of the resistive voltage dividing board 20A, increases the discharge reducing effect. Specifically, while the resistive voltage dividing board 2A has characteristics similar to those of a conductor having a thickness W1=35 μm, the resistive voltage dividing board 20A has characteristics similar to those of a conductor having a thickness W2=1.67 mm. The resistive voltage dividing board 20A, which is a double-sided board, produces a more significant effect of reducing discharge from the board than that of the resistive voltage dividing board 2A, which is a single-sided board.

Third Embodiment

Next, a third embodiment of the present invention will be described with reference to FIG. 17. In the third embodiment, the resistive voltage dividing boards are double-sided boards, and insulating sheets are stuck between the resistive voltage dividing boards.

Figure 17:
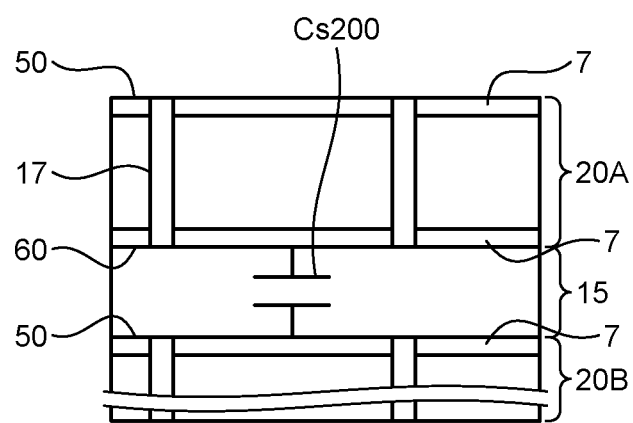
FIG. 17 is a diagram for explaining a capacitance occurring between resistive voltage dividing boards included in a voltage dividing device according to a third embodiment.

FIG. 17 is a diagram for explaining a capacitance occurring between the resistive voltage dividing boards included in the voltage dividing device according to the third embodiment. An implementation structure of the voltage dividing device 3 in the third embodiment differs from the implementation structure of the voltage dividing device 3 in the second embodiment in that insulating sheets 15 are added between the boards, and that the insulating sheets 15 and the boards are in intimate contact with each other. Thus, in the voltage dividing device 3 of the third embodiment, the capacitance of the board material is not present, and only capacitances Cs200 of the insulating sheets 15 are present. In addition, because all the insulating sheets 15 between the boards have the same thickness and the insulating sheets 15 and the boards are in intimate contact with each other, the individual distances d1, d2, and d3 each defined between the adjacent boards are equal to the thickness of the insulating sheets 15. Note that the boards are connected in series with one another through the connecting members 11 as in the voltage dividing device 3 of the first embodiment.

In a practical actual circuit of a total of four series-connected resistive voltage dividing boards similar to the resistive voltage dividing board 20A, the stray capacitances Cs1 to Cs12 are present between the boards as in the circuit of the voltage dividing device 3 according to the first embodiment illustrated in FIG. 8.

Because different capacitance values of the stray capacitances Cs1 to Cs12 may cause failure of the voltage dividing device 3, as explained in the first embodiment, the stray capacitances Cs1 to Cs12 are also controlled so that all the stray capacitances Cs1 to Cs12 have equal values in the third embodiment as in the first embodiment.

In the third embodiment, only the insulating sheets 15 are present between the boards, and the relative permittivity $\varepsilon_r$ is less likely to change depending upon the temperature or the humidity, which facilitates controlling the stray capacitances CsX such that the stray capacitances CsX have a common value.

The capacitance Cs200 of an insulating sheet 15 will now be explained. Products of the insulating sheet 15 vary in thickness and relative permittivity $\varepsilon_r$ depending on the material thereof. For example, assuming that the insulating sheet 15 has a thickness of 0.5 mm and a relative permittivity $\varepsilon_r$ of 3, the capacitance Cs200 of the insulating sheet 15 is $6.0\varepsilon_0 S$ [F].

As described above, according to the third embodiment, the implementation structure of the voltage dividing device 3 may be designed considering only the capacitances Cs200 of the insulating sheets 15 as the capacitances in the voltage dividing device 3, which facilitates the design of the implementation structure of the voltage dividing device 3. In addition, the voltage dividing device 3 of the third embodiment performs insulation with the insulating sheets 15 having a relative permittivity $\varepsilon_r$ higher than the relative permittivity $\varepsilon_r=1$. As a result, the distance between the boards can be smaller than that in the voltage dividing device 3 of the second embodiment, and the size of the voltage dividing device 3 of the third embodiment can be smaller than that of the voltage dividing device 3 of the second embodiment.

Fourth Embodiment

Next, a fourth embodiment of the invention will be described with reference to FIGS. 18 to 23. In the fourth embodiment, a method of arranging the resistive voltage dividing boards 2A to 2D to stand will be explained.

Figure 18:
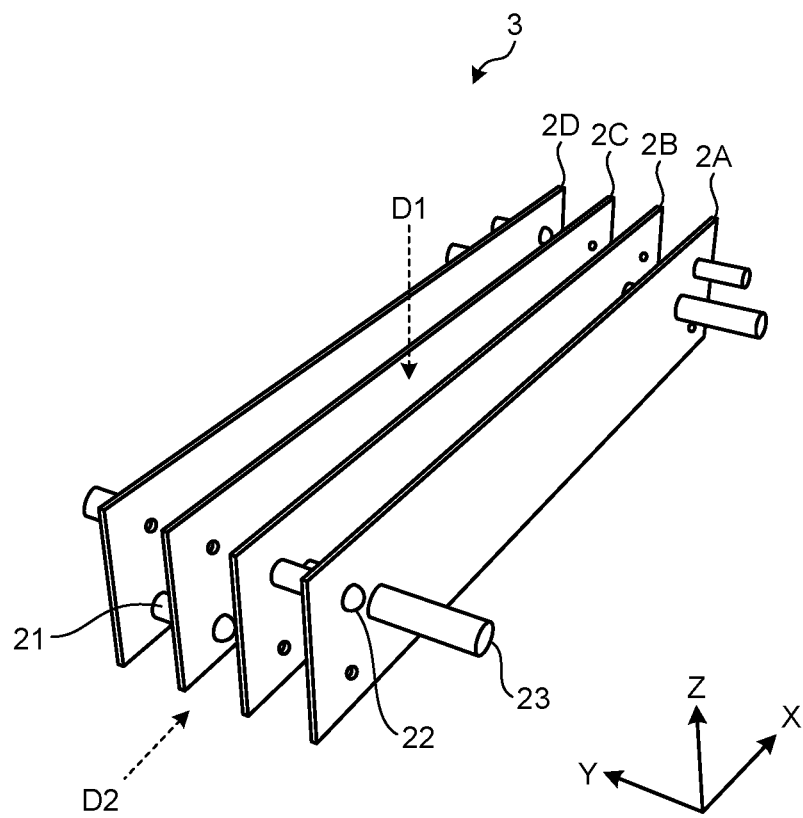
FIG. 18 is a perspective view of a configuration of the voltage dividing device having the resistive voltage dividing boards illustrated in FIG. 5, the boards standing in juxtaposition.
Figure 19:
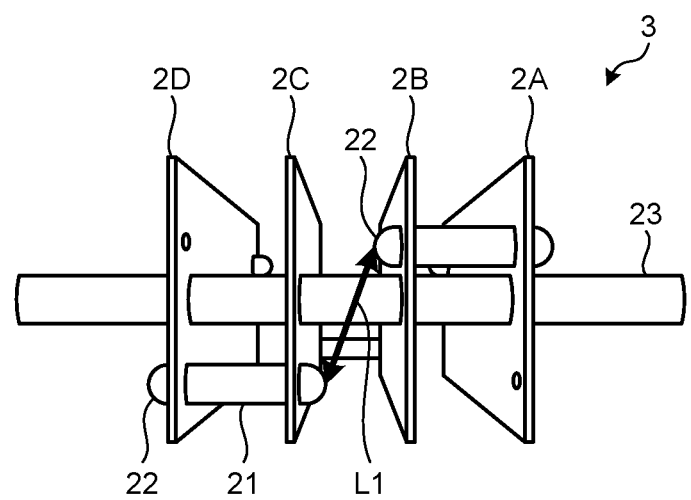
FIG. 19 is a front view of the voltage dividing device illustrated in FIG. 18.
Figure 20:
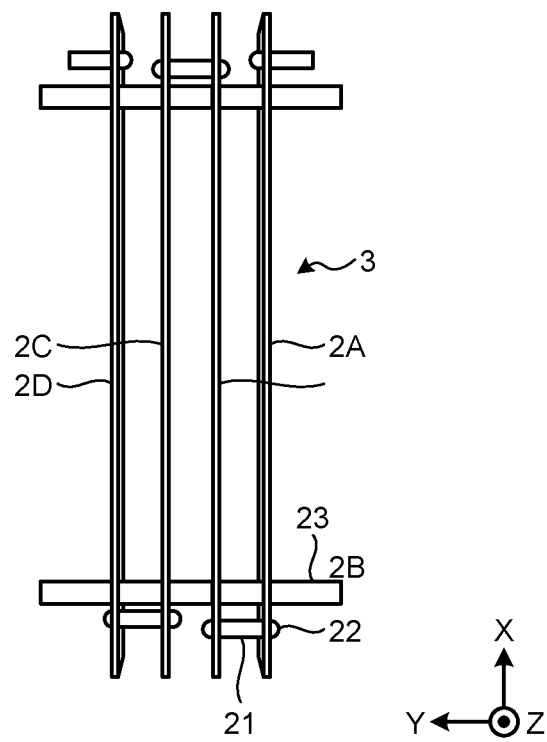
FIG. 20 is a top view of the configuration of the voltage dividing device illustrated in FIG. 18.
Figure 21:
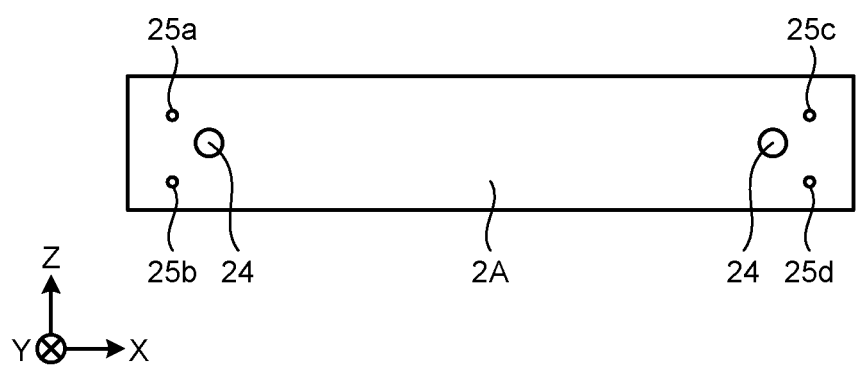
FIG. 21 is a diagram illustrating a configuration of a resistive voltage dividing board illustrated in FIG. 18.
Figure 22:
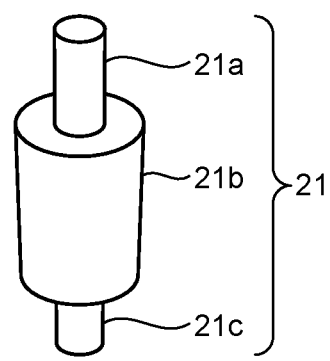
FIG. 22 is a diagram illustrating threaded portions of a connection terminal included in the voltage dividing device illustrated in FIG. 18.
Figure 23:
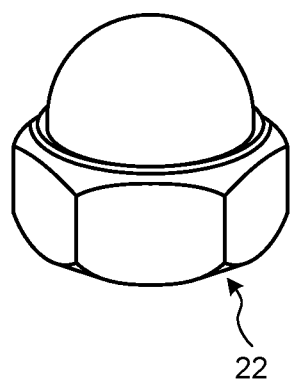
FIG. 23 is a diagram illustrating a configuration of a cap nut included in the voltage dividing device illustrated in FIG. 18.

FIG. 18 is a perspective view of a configuration of the voltage dividing device having the resistive voltage dividing boards illustrated in FIG. 5, the boards standing in juxtaposition. FIG. 19 is a front view of the voltage dividing device illustrated in FIG. 18. FIG. 20 is a top view of the configuration of the voltage dividing device illustrated in FIG. 18. FIG. 21 is a diagram illustrating a configuration of a resistive voltage dividing board illustrated in FIG. 18. FIG. 22 is a diagram illustrating a configuration of threaded portions of a connection terminal included in the voltage dividing device illustrated in FIG. 18, and FIG. 23 is a diagram illustrating a configuration of a cap nut included in the voltage dividing device illustrated in FIG. 18.

In FIGS. 18, 20, and 21, two axes perpendicular to each other within a plane parallel to the top faces of the resistive voltage dividing boards 2A to 2D are referred to as an X axis and a Y axis. In addition, an axis perpendicular to the X axis and the Y axis will be referred to as a Z axis. The X-axis direction is the longitudinal direction of the front faces of the resistive voltage dividing boards 2A to 2D. The Z-axis direction is the short direction of the front faces of the resistive voltage dividing boards 2A to 2D. The Y-axis direction is the thickness direction of the resistive voltage dividing boards 2A to 2D. In FIG. 18, a vertical direction parallel to the Z-axis direction is indicated by a top face direction D1, and a direction parallel to the X-axis direction is indicated by a front face direction D2.

The voltage dividing device 3 includes the resistive voltage dividing boards 2A to 2D, connection terminals 21, cap nuts 22, and fixing rods 23. The connection terminals 21 are terminals for electrically interconnecting the resistive voltage dividing boards 2A to 2D. The cap nuts 22 are nuts for fixing the resistive voltage dividing boards 2A to 2D to the connection terminals 21. The fixing rods 23 are rod members for mechanically fixing the resistive voltage dividing boards 2A to 2D.

As illustrated in FIG. 21, the resistive voltage dividing board 2A has fixing rod holes 24 and conductive through-holes 25a to 25d. The fixing rod holes 24 and the through-holes 25a to 25d are each a hole extending from the front face to the rear face through the resistive voltage dividing board 2A. The fixing rod holes 24 and the through-holes 25a to 25d are formed in opposite end portions in the longitudinal direction of the front face of the resistive voltage dividing board 2A.

Specifically, two through-holes 25a and 25b and one fixing rod hole 24 are formed in one end portion in the longitudinal direction of the front face of the resistive voltage dividing board 2A, and two through-holes 25c and 25d and one fixing rod hole 24 are formed in the other end portion thereof. In the resistive voltage dividing boards 2B to 2D as well, fixing rod holes 24 and through-holes 25a to 25d are formed at the same positions as found in the resistive voltage dividing board 2A.

For example, the through-holes 25a and 25c are at the same coordinate in the Z-axis direction, and the through-holes 25b and 25d are at the same coordinate in the Z-axis direction. The coordinates of the through-holes 25a and 25b in the X-axis direction may be the same as or different from each other. In addition, the coordinates of the through-holes 25c and 25d in the X-axis direction may be the same as or different from each other. FIG. 20 illustrates a case where the coordinates of the through-holes 25a and 25b in the X-axis direction are different from each other, and the coordinates of the through-holes 25c and 25d in the X-axis direction are different from each other. FIG. 21 illustrates a case where the through-holes 25a and 25b are at the same coordinate in the X-axis direction and the through-holes 25c and 25d are at the same coordinate in the X-axis direction.

The coordinates in the XZ plane, of the through-holes 25a to 25d of each of the resistive voltage dividing board 2B to 2C are the same as the coordinates in the XZ plane of the through-holes 25a to 25d of the resistive voltage dividing board 2A. Note that, in the description below, the through-holes 25a to 25d may be referred to as through-holes 25 when the through-holes 25a to 25d need not be distinguished from each other.

A fixing rod 23, which is inserted through the fixing rod holes 24 of the resistive voltage dividing boards 2A to 2D, extends through all the resistive voltage dividing boards 2A to 2D, and has both ends fixed to another structure. When any one of the resistive voltage dividing boards 2A to 2D is referred to as one resistive voltage dividing board and a resistive voltage dividing board adjacent to the one resistive voltage dividing board is referred to as the other resistive voltage dividing board, a fixing rod hole 24 formed in the one resistive voltage dividing board will be referred to as a first hole and a fixing rod hole 24 formed in the other resistive voltage dividing boards will be referred to as a second hole.

As illustrated in FIG. 22, a connection terminal 21 includes threaded portions 21a and 21c, and a cylindrical insulating portion 21b. The threaded portions 21a and 21c are connected through a rod-like conductive member, and the rod-like conductive member is covered with the insulating portion 21b. The rod-like conductive member and the threaded portions 21a and 21c are formed integrally with one another, and the integrally-formed member extends through the cylindrical insulating portion 21b. In this configuration, the threaded portion 21a is located on the side of one end of the insulating portion 21b, and the threaded portion 21c is located on the side of the other end of the insulating portion 21b. Because the threaded portions 21a and 21c are connected to each other through the rod-like conductive member inside the insulating portion 21b, the threaded portions 21a and 21c are electrically connected to each other.

The resistive voltage dividing boards 2A and 2B are electrically connected to each other through the connection terminal 21. Similarly, the resistive voltage dividing boards 2B and 2C are electrically connected to each other through a connection terminal 21, and the resistive voltage dividing boards 2C and 2D are electrically connected to each other through a connection terminal 21.

The length of the insulating portion 21b of the connection terminal 21 can be changed to adjust the distance between the adjacent resistive voltage dividing boards 2A and 2B. Similarly, the length of the insulating portion 21b of the connection terminal 21 can be changed to adjust the distance between the resistive voltage dividing boards 2B and 2C and the distance between the resistive voltage dividing boards 2C and 2D.

In the case of the resistive voltage dividing boards 2A and 2B, the threaded portion 21a of the connection terminal 21 is inserted through the through-hole 25a in the resistive voltage dividing board 2A, and a cap nut 22 is screwed onto the threaded portion 21a from a direction opposite the insertion side. Similarly, the threaded portion 21c of the connection terminal 21 inserted through the through-hole 25a in the resistive voltage dividing board 2A is inserted through the through-hole 25a in the resistive voltage dividing board 2B, and a cap nut 22 is screwed onto the threaded portion 21c from a direction opposite the insertion side.

As a result, the connection terminal 21 and the resistive voltage dividing board 2A are fixed to each other by the cap nut 22, the connection terminal 21 and the resistive voltage dividing board 2B are fixed to each other by the cap nut 22, and the resistive voltage dividing boards 2A and 2B are fixed to each other by the connection terminal 21. In this case, the cap nut 22 and the through-hole 25a are in contact with each other, thereby making electrical connection between the adjacent resistive voltage dividing boards 2A and 2B.

For example, assume that the resistive voltage dividing board 2A is one resistive voltage dividing board, and the resistive voltage dividing board 2B is the other resistive voltage dividing board. In this case, the cap nut 22 that fixes the resistive voltage dividing board 2A and the connection terminal 21 to each other is a first cap nut, and the cap nut 22 that fixes the resistive voltage dividing board 2B and the connection terminal 21 to each other is a second cap nut. Further, the through-hole 25a formed in the resistive voltage dividing board 2A is a third hole, and the through-hole 25a formed in the resistive voltage dividing board 2B is a fourth hole. Furthermore, the threaded portion 21a screwed in the through-hole 25a formed in the resistive voltage dividing board 2A is a first threaded portion, and the threaded portion 21c screwed in the through-hole 25a formed in the resistive voltage dividing board 2B is a second threaded portion.

The through-hole 25a in the resistive voltage dividing board 2A and the through-hole 25a in the resistive voltage dividing board 2B are used for connection between the resistive voltage dividing boards 2A and 2B. The through-hole 25d in the resistive voltage dividing board 2B and the through-hole 25d in the resistive voltage dividing board 2C are used for connection between the resistive voltage dividing boards 2B and 2C. In addition, the through-hole 25b in the resistive voltage dividing board 2C and the through-hole 25b in the resistive voltage dividing board 2D are used for connection between the resistive voltage dividing boards 2C and 2D. For connection of the resistive voltage dividing board 2A to a resistive voltage dividing board located on a side opposite the resistive voltage dividing board 2B, the through-hole 25c is used. In addition, for connection of the resistive voltage dividing board 2D to a resistive voltage dividing board located on a side opposite the resistive voltage dividing board 2C, the through-hole 25c is used.

As described above, the connection terminals 21 are positioned so as not to be close to each other between the resistive voltage dividing boards 2A to 2D. Specifically, the connection terminals 21 are arranged between the resistive voltage dividing boards 2A to 2D in such a manner that the coordinates in the XZ plane, of the connection terminal 21 that connects the resistive voltage dividing boards 2A and 2B to each other, the coordinates in the XZ plane, of the connection terminal 21 that connects the resistive voltage dividing boards 2B and 2C to each other, and the coordinates in the XZ plane, of the connection terminal 21 that connects the resistive voltage dividing boards 2C and 2D to each other are not the same as one another. For example, when a first through-hole 25 (the through-hole 25a in FIG. 21) is used for connection of the front face side of the resistive voltage dividing board 2B, a second through-hole 25 (the through-hole 25b in FIG. 21) closest to the first through-hole 25 is not used for connection of the rear face side of the resistive voltage dividing board 2B but a third through-hole 25 (the through-hole 25d in FIG. 21) on the opposite side in the longitudinal direction is used instead of the second though-hole.

In addition, when the third through-hole 25 (the through-hole 25d in FIG. 21) is used for connection of the front face side of the resistive voltage dividing board 2C, a fourth through-hole 25 (the through-hole 25c in FIG. 21) closest to the third through-hole 25 is not used for connection of the rear face side of the resistive voltage dividing board 2C but the first or second through-hole 25 on the opposite side in the longitudinal direction is used instead of the fourth through-hole. In this case, because the first through-hole 25 is used for connection of the front face side of the resistive voltage dividing board 2B, the second through-hole 25 is used for connection of the rear face side of the resistive voltage dividing board 2C.

As a result, an insulation distance L1 between the cap nuts 22 of adjacent ones of the resistive voltage dividing boards 2A to 2D can be longer. In addition, an insulation distance between the cap nut 22 on the front face side and the cap nut 22 on the rear face side of each of the resistive voltage dividing boards 2A to 2D can be longer.

As described above, in the fourth embodiment, the connection terminals 21 are arranged between the resistive voltage dividing boards 2A to 2D in such a manner that the coordinates in the XZ plane, of the connection terminal 21 that connects the resistive voltage dividing boards 2A and 2B to each other, the coordinates in the XZ plane, of the connection terminal 21 that connects the resistive voltage dividing boards 2B and 2C to each other, and the coordinates in the XZ plane, of the connection terminal 21 that connects the resistive voltage dividing boards 2C and 2D to each other are different from one another. This enables electrical connection between the resistive voltage dividing boards 2A to 2D as well as securing the insulation distances between the cap nuts 22.

The configurations presented in the above embodiments are examples of the present invention, and can be combined with other known technologies or can be partly omitted or modified without departing from the scope of the present invention.

REFERENCE SIGNS LIST 1 high-voltage source; 2A to 2D, 20A, 20B resistive voltage dividing board; 3 voltage dividing device; 4 sensing resistor; 5, 50 front face; 6, 60 rear face; 7 copper pattern; 10 electrode; 11 connecting member; 15 insulating sheet; 17 via; 21 connection terminal; 21a, 21c threaded portion; 21b insulating portion; 22 cap nut; 23 fixing rod; 24 fixing rod hole; 25, 25a to 25d through-hole; 40 first unit; 45 supporting member; 100 voltage detection system; a to e connection point; C0 to C16 chip capacitor; R0 to R16 chip resistor.

The invention claimed is:

1. A voltage dividing device for dividing a voltage output from a voltage source, the voltage dividing device comprising:
   a plurality of resistive voltage dividing boards each being a plate-like board having a first face, the board having a plurality of conductor patterns arranged on the first face, the conductor patterns being connected in series with one another through capacitors and resistors connected in parallel on the first face, wherein
   adjacent ones of the resistive voltage dividing boards are connected in series with each other through a conductive member, the adjacent resistive voltage dividing boards including one resistive voltage dividing board having a first face and a second face located rearwardly of the first face, and
   the adjacent resistive voltage dividing boards are arranged such that the second face of the one resistive voltage dividing board and a first face of the other of the adjacent resistive voltage dividing boards face each other, and that the conductor patterns arranged on the first face of the one resistive voltage dividing board are disposed oppositely from the conductor patterns arranged on the first face of the other resistive voltage dividing board with the one resistive voltage dividing board disposed therebetween.

2. The voltage dividing device according to claim 1, wherein
   the adjacent resistive voltage dividing boards are arranged in parallel to each other such that the second face of the one resistive voltage dividing board and the first face of the other resistive voltage dividing board face each other.

3. The voltage dividing device according to claim 1, wherein
   the resistive voltage dividing boards are arranged at equal distances each of which is defined between the second face of the one of the adjacent resistive voltage dividing boards and the first face of the other of the adjacent resistive voltage dividing boards.

4. The voltage dividing device according to claim 1, wherein
   the resistive voltage dividing boards each have the first face having a rectangular shape, and the resistive voltage dividing boards stand in juxtaposition such that longitudinally extending side faces of the resistive voltage dividing boards are disposed in a horizontal orientation.

5. The voltage dividing device according to claim 1, wherein
   the resistive voltage dividing boards are stacked in layers in a direction parallel to a vertical direction.

6. The voltage dividing device according to claim 1, wherein
   an atmosphere environment under which the resistive voltage dividing boards are arranged is filled with dry air, nitrogen, hydrogen, or sulfur hexafluoride.

7. The voltage dividing device according to claim 1, wherein
   the resistive voltage dividing boards are single-sided boards each having a first face and a second face, the conductor patterns being arranged on the first face, no conductor patterns being arranged on the second face.

8. The voltage dividing device according to claim 1, wherein
   the resistive voltage dividing boards are double-sided boards each having a first face and a second face, the conductor patterns being arranged on the first face and the second face, and
   the conductor patterns arranged on the first face of the board are connected through vias to the conductor patterns arranged on the second face of the board.

9. The voltage dividing device according to claim 8, wherein
   the conductor patterns arranged on the first face of the board and the conductor patterns arranged on the second face of the board have the same shapes and the same sizes, and are arranged oppositely from each other.

10. The voltage dividing device according to claim 8, wherein
    an insulating sheet is disposed between the second face of the one resistive voltage dividing board and the first face of the other resistive voltage dividing board such that the insulating sheet is in contact with the second face of the one resistive voltage dividing board and the first face of the other resistive voltage dividing board and faces the second face of the one resistive voltage dividing board and the first face of the other resistive voltage dividing board.

11. The voltage dividing device according to claim 1, wherein
    the conductor patterns that are closest to corners of the resistive voltage dividing boards among the conductor patterns have corners rounded off.

12. The voltage dividing device according to claim 1, further comprising:
    a connection terminal to electrically connect the one resistive voltage dividing board to the other resistive voltage dividing board;
    a first cap nut to fix the one resistive voltage dividing board and the connection terminal to each other;
    a second cap nut to fix the other resistive voltage dividing board and the connection terminal to each other; and
    a fixing rod extending through a first hole formed in the one resistive voltage dividing board and a second hole formed in the other resistive voltage dividing board to mechanically fix the one resistive voltage dividing board and the other resistive voltage dividing board to each other, wherein
    the connection terminal includes a first threaded portion extending through a third hole formed in the one resistive voltage dividing board, and a second threaded portion extending through a fourth hole formed in the other resistive voltage dividing board,
    the first cap nut is screwed onto the first threaded portion extending through the third hole, and
    the second cap nut is screwed onto the second threaded portion extending through the fourth hole.

13. The voltage dividing device according to claim 1, wherein
    the capacitors and the resistors connected in parallel are connected in series throughout the resistive voltage dividing boards.

14. A voltage dividing device for dividing a voltage output from a voltage source, the voltage dividing device comprising:
    a plurality of resistive voltage dividing boards each being a plate-like board having a first face, the board having a plurality of conductor patterns arranged on the first face, the conductor patterns being connected in series with one another through capacitors and resistors connected in parallel on the first face, wherein the resistive voltage dividing boards are connected in series with one another through conductive members, adjacent ones of the resistive voltage dividing boards including one resistive voltage dividing board having a first face and a second face located rearwardly of the first face, the adjacent resistive voltage dividing boards are arranged such that the second face of the one resistive voltage dividing board and a first face of the other of the adjacent resistive voltage dividing boards face each other, and that the conductor patterns arranged on the first face of the one resistive voltage dividing board are disposed oppositely from the conductor patterns arranged on the first face of the other resistive voltage dividing board with the one resistive voltage dividing board disposed therebetween, and an atmosphere environment under which the resistive voltage dividing boards are arranged is filled with dry air, nitrogen, hydrogen, or sulfur hexafluoride.

15. The voltage dividing device according to claim 14, wherein the adjacent resistive voltage dividing boards are arranged in parallel to each other such that the second face of the one resistive voltage dividing board and the first face of the other resistive voltage dividing board face each other.

16. The voltage dividing device according to claim 14, wherein the resistive voltage dividing boards are arranged at equal distances each of which is defined between the second face of the one of the adjacent resistive voltage dividing boards and the first face of the other of the adjacent resistive voltage dividing boards.

17. The voltage dividing device according to claim 14, wherein the resistive voltage dividing boards each have the first face having a rectangular shape, and the resistive voltage dividing boards stand in juxtaposition such that longitudinally extending side faces of the resistive voltage dividing boards are disposed in a horizontal orientation.

18. The voltage dividing device according to claim 14, wherein the resistive voltage dividing boards are stacked in layers in a direction parallel to a vertical direction.

19. The voltage dividing device according to claim 14, further comprising:

a connection terminal to electrically connect the one resistive voltage dividing board to the other resistive voltage dividing board;

a first cap nut to fix the one resistive voltage dividing board and the connection terminal to each other;

a second cap nut to fix the other resistive voltage dividing board and the connection terminal to each other; and a fixing rod extending through a first hole formed in the one resistive voltage dividing board and a second hole formed in the other resistive voltage dividing board to mechanically fix the one resistive voltage dividing board and the other resistive voltage dividing board to each other, wherein the connection terminal includes a first threaded portion extending through a third hole formed in the one resistive voltage dividing board, and a second threaded portion extending through a fourth hole formed in the other resistive voltage dividing board, the first cap nut is screwed onto the first threaded portion extending through the third hole, and the second cap nut is screwed onto the second threaded portion extending through the fourth hole.

20. The voltage dividing device according to claim 14, wherein the capacitors and the resistors connected in parallel are connected in series throughout the resistive voltage dividing boards.

* * * * *